US011217650B2

(12) United States Patent
Terai et al.

(10) Patent No.: US 11,217,650 B2
(45) Date of Patent: Jan. 4, 2022

(54) DISPLAY UNIT

(71) Applicant: JOLED INC., Tokyo (JP)

(72) Inventors: Yasuhiro Terai, Tokyo (JP); Yasuharu Shinokawa, Tokyo (JP); Jiro Yamada, Tokyo (JP); Atsuhito Murai, Tokyo (JP); Masahiko Kondo, Tokyo (JP); Noriteru Maeda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/209,882

(22) Filed: Dec. 4, 2018

(65) Prior Publication Data

US 2019/0348488 A1 Nov. 14, 2019

(30) Foreign Application Priority Data

May 8, 2018 (JP) .............................. JP2018-089884

(51) Int. Cl.
*H01L 29/08* (2006.01)
*H01L 35/24* (2006.01)
*H01L 51/00* (2006.01)
*H01L 27/32* (2006.01)
(Continued)

(52) U.S. Cl.
CPC ........ *H01L 27/3276* (2013.01); *H01L 27/124* (2013.01); *H01L 27/322* (2013.01); *H01L 51/5218* (2013.01); *H01L 51/5228* (2013.01); *H01L 51/5234* (2013.01); *H01L 51/5284* (2013.01); *H01L 2251/5315* (2013.01)

(58) Field of Classification Search
CPC . H01L 27/124; H01L 27/322; H01L 27/3276; H01L 51/5218; H01L 51/5228; H01L 51/5234; H01L 51/5284; H01L 2251/5315; H01L 2251/5323; H01L 27/3211; H01L 27/3279
USPC ....................................... 257/40–43
See application file for complete search history.

(56) References Cited

U.S. PATENT DOCUMENTS

| 2004/0160170 A1 | 8/2004 | Sato et al. |
| 2005/0077816 A1* | 4/2005 | Yamada .............. H01L 51/5228 313/503 |
| 2009/0215350 A1 | 8/2009 | Takei et al. |

(Continued)

FOREIGN PATENT DOCUMENTS

| CN | 104466021 A | 3/2015 |
| JP | 2004-207217 A | 7/2004 |

(Continued)

*Primary Examiner* — Meiya Li
(74) *Attorney, Agent, or Firm* — Hauptman Ham, LLP

(57) ABSTRACT

A display unit includes a substrate, a first electrode, a second electrode, an organic layer, and an auxiliary electrically-conductive layer. The substrate includes a pixel region including a plurality of pixels and a peripheral region outside the pixel region. The first electrode is provided for each of the plurality of pixels in the pixel region on the substrate. The second electrode is opposed to the first electrode, and is provided common for the plurality of pixels. The organic layer is provided between the second electrode and the first electrode, and includes a light-emitting layer. The auxiliary electrically-conductive layer includes an organic electrically-conductive material, and the auxiliary electrically-conductive layer is disposed in the pixel region on the substrate and is electrically coupled to the second electrode.

18 Claims, 13 Drawing Sheets

(51) Int. Cl.
  *H01L 51/52* (2006.01)
  *H01L 27/12* (2006.01)

(56) References Cited

U.S. PATENT DOCUMENTS

| | | |
|---|---|---|
| 2010/0302221 A1 | 12/2010 | Okumoto |
| 2012/0327498 A1 | 12/2012 | Arai et al. |
| 2013/0153940 A1 | 6/2013 | Suganuma et al. |
| 2014/0077171 A1 | 3/2014 | Yamakita et al. |
| 2015/0021571 A1* | 1/2015 | Yamakita ............ H01L 51/5228 257/40 |
| 2015/0179974 A1 | 6/2015 | Matsuura |
| 2015/0243933 A1* | 8/2015 | Lee .................... H01L 51/5281 257/40 |
| 2016/0149155 A1 | 5/2016 | Kim |
| 2019/0288044 A1 | 9/2019 | Hou |

FOREIGN PATENT DOCUMENTS

| | | |
|---|---|---|
| JP | 2009231264 A | 10/2009 |
| JP | 201140167 A | 2/2011 |
| JP | 201218938 A | 1/2012 |
| JP | 20133480 A | 1/2013 |
| JP | 2013127862 A | 6/2013 |
| JP | 2013-196919 A | 9/2013 |
| JP | 2015125808 A | 7/2015 |
| KR | 1020150097854 A | 8/2015 |
| WO | 2019001317 A1 | 1/2019 |

* cited by examiner

DISPLAY UNIT

CROSS REFERENCE TO RELATED APPLICATIONS

This application claims the benefit of Japanese Priority Patent Application JP 2018-089884 filed on May 8, 2018, the entire contents of which are incorporated herein by reference.

BACKGROUND

The technology relates to a display unit using an organic electroluminescence (EL) element.

The organic EL element includes, between a first electrode and a second electrode, an organic layer including a light-emitting layer. For example, reference is made to Japanese Unexamined Patent Application Publication Nos. 2004-207217 and 2013-196919. In a display unit using the organic EL element, for example, the first electrode, the organic layer, and the second electrode are provided in this order on a driving substrate including a thin film transistor (TFT). In the display unit of a top-emission type, light generated by the light-emitting layer is extracted from side of the second electrode. Hence, the second electrode has light transmissivity with respect to light in a wavelength region generated by the light-emitting layer, e.g., light in a visible region. For example, the second electrode includes an inorganic transparent electrically-conductive material.

SUMMARY

The display unit using such an organic EL element is requested to reduce resistance of a second electrode.

It is desirable to provide a display unit that makes it possible to reduce resistance of a second electrode.

A display unit according to an embodiment of the disclosure includes a substrate, a first electrode, a second electrode, an organic layer, and an auxiliary electrically-conductive layer. The substrate includes a pixel region including a plurality of pixels and a peripheral region outside the pixel region. The first electrode is provided for each of the plurality of pixels in the pixel region on the substrate. The second electrode is opposed to the first electrode, and is provided common for the plurality of pixels. The organic layer is provided between the second electrode and the first electrode, and includes a light-emitting layer. The auxiliary electrically-conductive layer includes an organic electrically-conductive material, and the auxiliary electrically-conductive layer is disposed in the pixel region on the substrate and is electrically coupled to the second electrode.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Figure 1:
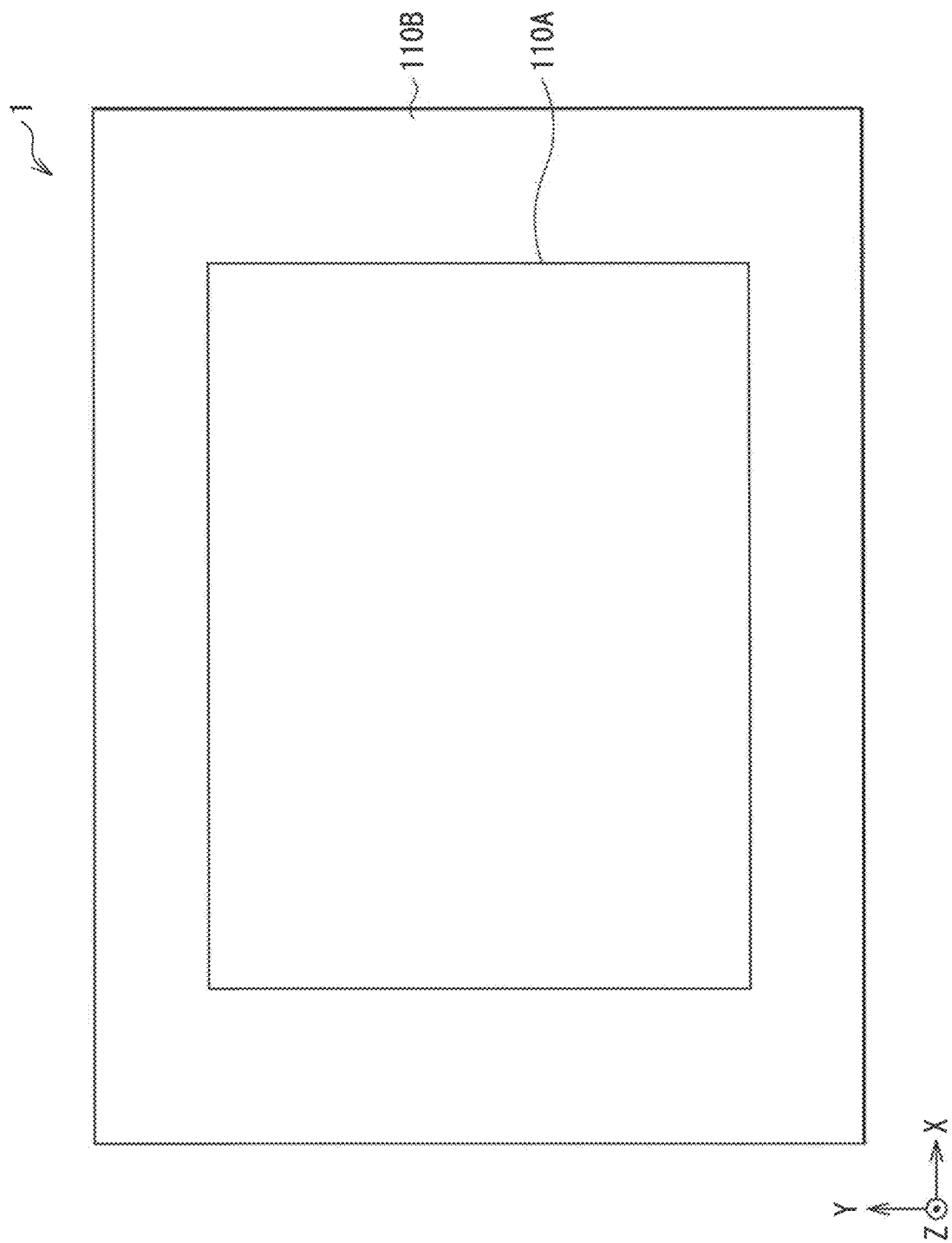
FIG. 1 is a schematic plan view of an overall configuration of a display unit according to one example embodiment of the disclosure.

Some example embodiments of the technology are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (A display unit including an auxiliary electrically-conductive layer in a pixel region)
2. Modification Example 1 (An example of the auxiliary electrically-conductive layer not coupled to wiring lines)
3. Modification Example 2 (An example of the auxiliary electrically-conductive layer provided on a second electrode)
4. Modification Example 3 (An example of the auxiliary electrically-conductive layer including an organic transparent electrically-conductive material)
5. Second Example Embodiment (A display unit of a bottom emission type)
6. Application Example (An example of an electronic apparatus)

1. First Example Embodiment

[Basic Configuration]

FIG. 1 schematically illustrates an overall configuration of a display unit, i.e., a display unit 1 according to a first example embodiment of the disclosure. The display unit 1 may be, for example, an organic EL display including organic electroluminescence (EL) elements. The display unit 1 may be of a top-emission type that outputs light of any of red (R), green (G), and blue (B) from a top face. The display unit 1 may have a pixel region 110A in the middle and a peripheral region 110B outside the pixel region 110A. The pixel region 110A may have a quadrangular shape, for example. The peripheral region 110B may have a bezel shape surrounding the pixel region 110A.

Figure 2:
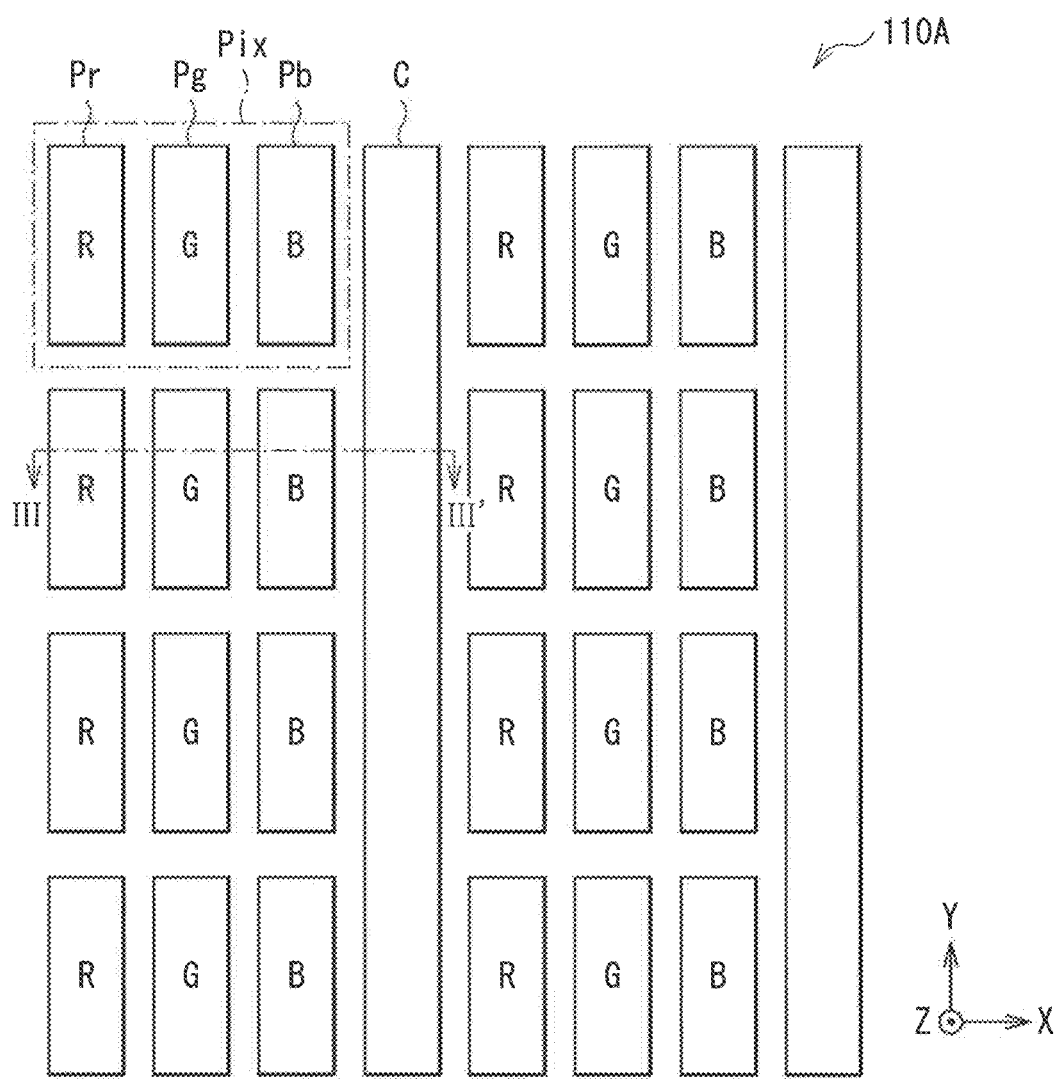
FIG. 2 is a schematic plan view of an example of a configuration of a pixel region illustrated in FIG. 1.

FIG. 2 illustrates an example of a planar configuration of the pixel region 110A. The pixel region 110A may include a plurality of pixels pr, pg, and pb that are arranged two-dimensionally. An image may be displayed on the pixel region 110A by an active-matrix scheme on the basis of an externally received image signal, for example. The pixels pr, pg, and pb may each correspond to, for example, a sub-pixel, and a set of the pixels pr, pg, and pb may configure one pixel, i.e., a pixel Pix. In the display unit 1, the pixel region 110A may include an auxiliary electrically-conductive section C together with the pixels Pix. The auxiliary electrically-conductive section C may be disposed at a position not overlaid on the pixels Pix in plan view, i.e., in X-Y plan view illustrated in FIG. 2.

The pixels pr, pg, and pb may each have a surface, for example, in a rectangular shape, and may be disposed in stripes as a whole. Pixels that emit light of the same color may be aligned in a direction (i.e., a column direction in FIG. 2) along a long side of the rectangular shape of each of the pixels pr, pg, and pb. The pixels pr may display a red (R) color. The pixels pg may display a green (G) color. The pixels pb may display a blue (B) color. For example, the auxiliary electrically-conductive section C may be provided, in a band-like shape extending in the column direction, between corresponding adjacent (two) columns of the pixels Pix, or in a specific but non-limiting example, between a corresponding column of the pixels pb and a corresponding column of the pixels pr. A plurality of auxiliary electrically-conductive sections C, for example may be provided in the pixel region 110A. In the pixel region 110A, the auxiliary electrically-conductive sections C having the band-like shape may be disposed in parallel with one another, for example. In other words, the auxiliary electrically-conductive sections C may be disposed in stripes.

Figure 3:
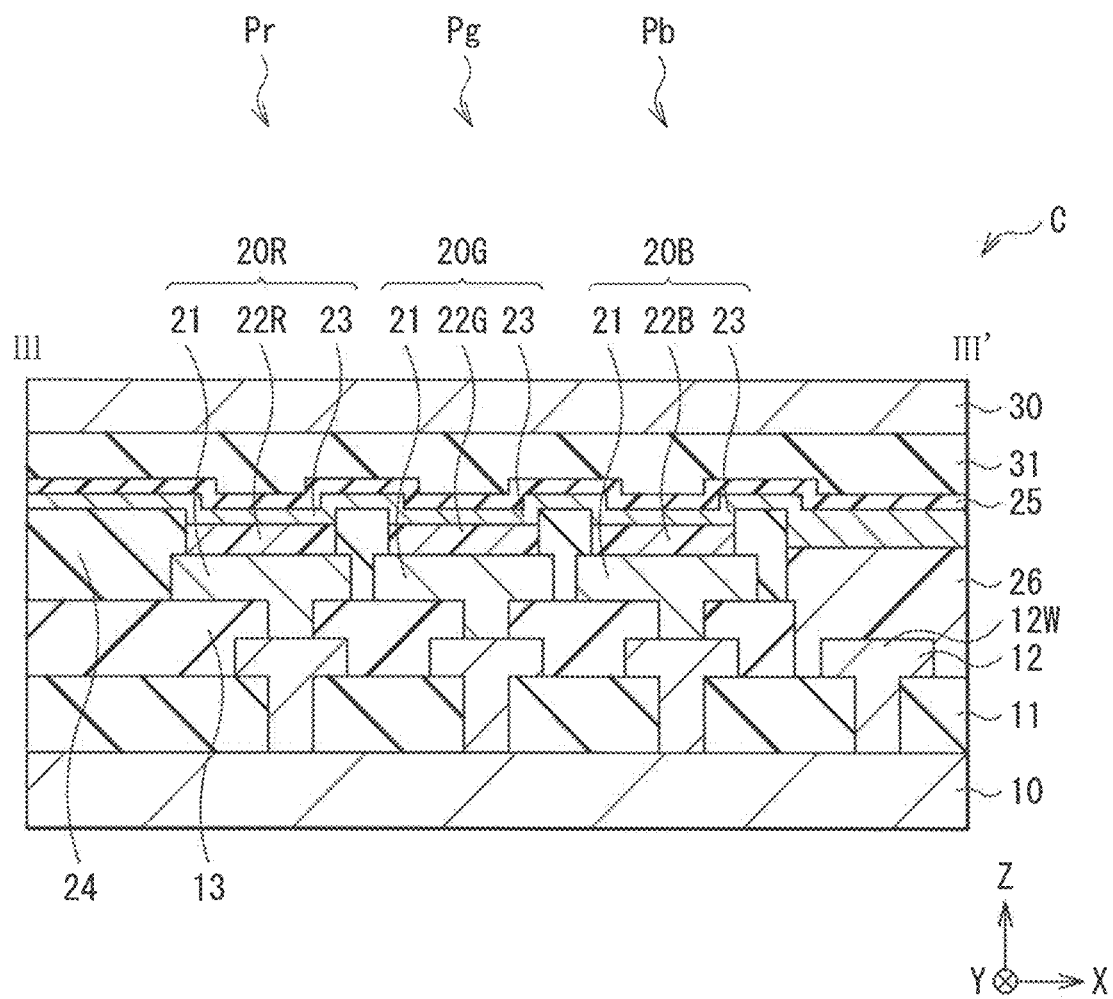
FIG. 3 is a schematic view of a cross-sectional configuration taken along line III-III' illustrated in FIG. 2.

FIG. 3 illustrates a cross-sectional configuration taken along line III-III' illustrated in FIG. 2.

The display unit 1 may include organic EL elements 20R, 20G, and 20B in the pixel region 110A. The organic EL elements 20R, 20G, and 20B may be sealed between a driving substrate 10 and a counter substrate 30 that are opposed to each other. The pixels pr, pg, and pb may respectively include the organic EL elements 20R, 20G, and 20B. The display unit 1 may include an interlayer insulating film 11, a wiring layer 12, and a planarizing film 13 in this order on the driving substrate 10. Each of the organic EL elements 20R, 20G, and 20B may be provided on the planarizing film 13, and may include the first electrode 21, corresponding one of organic layers 22R, 22G, and 22B each including a light-emitting layer, and the second electrode 23 in this order from the planarizing film 13. A partition wall 24 may be provided between the first electrode 21 and the second electrode 23, and the partition wall 24 may have openings serving as light emission regions of the organic EL elements 20R, 20G, and 20B. For example, a protective film 25 may be provided on the organic EL elements 20R, 20G, and 20B, and the counter substrate 30 may be joined onto the sealing layer 31 provided on the protective film 25.

The driving substrate 10 may include, for example, a substrate, and a TFT provided on the substrate. The substrate may include, for example, glass. The substrate may include, for example, quartz, silicon, or a resin material, or may be a metal plate. Non-limiting example of the resin material may include polyethylene terephthalate (PET), polyimide (PI), polycarbonate (PC), and polyethylene naphthalate (PEN).

Figure 7:
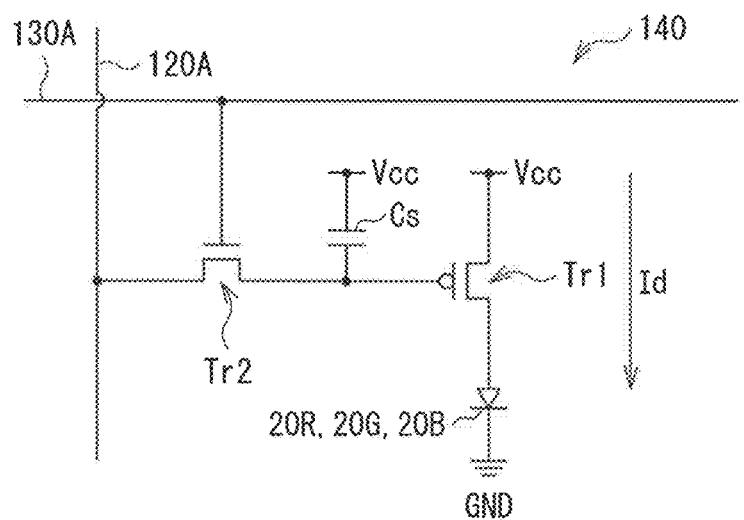
FIG. 7 is an equivalent circuit diagram illustrating an example of a configuration of a pixel circuit illustrated in FIG. 6.

The TFT may correspond to a driving transistor Tr1 and a switching transistor Tr2 of a pixel circuit 140 described later illustrated in FIG. 7, which is described later. The TFT may be provided for each of the pixels pr, pg, and pb. The TFT may include, for example, a semiconductor layer, a gate insulating film, and a gate electrode in this order in a selective region on the substrate. For example, an oxide semiconductor material may be used for the semiconductor layer. In this example, the TFT may each have, but not limited to, a so-called top-gate structure. In an alternative embodiment, however, the TFT may have a so-called bottom-gate structure. The semiconductor layer may include a silicon-based semiconductor such as amorphous silicon, polycrystalline silicon (also called polysilicon), or microcrystalline silicon.

The interlayer insulating film 11 provided on the driving substrate 10 may cover, for example, the semiconductor layer, the gate insulating film, and the gate electrode of the TFT. The wiring layer 12 including a plurality of wiring lines may be provided on the interlayer insulating film 11. The wiring layer 12 may include the wiring lines each provided for corresponding one of the pixels pr, pg, and pb. Each of the wiring lines may be electrically coupled to corresponding one of the TFTs, i.e., the driving substrate 10 via corresponding one of contact holes provided in the interlayer insulating film 11.

The interlayer insulating film 11 may include an inorganic insulating material or an organic insulating material. Non-limiting examples of the inorganic insulating material may include silicon oxide ($SiO_2$) and silicon nitride (SiN). Non-limiting examples of the organic insulating material may include resin materials such as polyimide. The interlayer insulating film 11 may be configured by a single layer, or may be configured by a stacked film of the inorganic insulating material and the organic insulating material, for example. The wiring lines of the wiring layer 12 may include, for example, an electrically-conductive metal material.

The planarizing film 13 may be provided across an entire surface of the driving substrate 10 to cover the wiring layer 12. The planarizing film 13 may be configured by stacking of an inorganic insulating film and an organic insulating film in this order from side of the driving substrate 10, for example. The inorganic insulating film may be, for example, a silicon oxide ($SiO_2$) film having a thickness of 200 nm. Alternatively, the inorganic insulating film may be, for example, a silicon nitride (SiN) film, a silicon oxynitride (SiON) film, or a stacked film thereof. The organic insulating film may be, for example, a polyimide resin film. The polyimide resin film may have a thickness of 3000 nm, for example. Alternatively, the organic insulating film may include, for example, an epoxy resin, a novolac resin, or an acrylic resin.

The organic EL element 20R may include the first electrode 21, the organic layer 22R, and the second electrode 23 in this order on the planarizing film 13. The organic EL element 20G may include the first electrode 21, the organic layer 22G, and the second electrode 23 in this order on the planarizing film 13. The organic EL element 20B may include the first electrode 21, the organic layer 22B, and the second electrode 23 in this order on the planarizing film 13. The first electrodes 21 of the organic EL elements 20R, 20G, and 20B may be provided separately and respectively for the pixels pr, pg, and pb. The second electrode 23 may be provided common for all the pixels pr, pg, and pb. Light-emitting layers of the organic layers 22R, 22G, and 22B may be provided separately and respectively for the pixels pr, pg, and pb, for example.

The first electrodes 21 may each be, for example, a reflective electrode serving as an anode. Each of the first electrodes 21 provided in corresponding one of the pixels pr, pg, and pb may be electrically coupled to corresponding one of TFTs of the driving substrate 10 via corresponding one of the wiring lines of the wiring layer 12. An end of each of the first electrodes 21 may be covered with the partition wall 24.

Non-limiting examples of a constituent material of the first electrode 21 may include a simple substance and an alloy of a metal element such as aluminum (Al), chromium, gold (Au), platinum (Pt), nickel (Ni), copper (Cu), tungsten, and silver (Ag). Alternatively, the first electrode 21 may include a stacked film of a metal film and a transparent electrically-conductive film including an electrically-conductive material having visible-light transmissivity. The metal film may include a simple substance or an alloy of any of the above-described metal elements. Non-limiting examples of the transparent electrically-conductive material included in the transparent electrically-conductive film may include indium-tin oxide (ITO), indium-zinc oxide (IZO), and a zinc oxide (ZnO)-based material. Non-limiting examples of the zinc oxide-based material may include aluminum (Al)-doped zinc oxide (AZO) and gallium-doped zinc oxide (GZO). The first electrode 21 may have, for example, a thickness of 100 nm to 1000 nm both inclusive.

The auxiliary electrically-conductive section C may include, for example, the auxiliary electrically-conductive layer 26 and the second electrode 23 in this order on the planarizing film 13. In other words, the pixels pr, pg, and pb may respectively include the organic EL elements 20R, 20G, and 20B, and the auxiliary electrically-conductive section C may include the auxiliary electrically-conductive layer 26 and the second electrode 23. In the auxiliary electrically-conductive section C, for example, a top surface of the auxiliary electrically-conductive layer 26 may be in contact with the second electrode 23 to electrically couple the auxiliary electrically-conductive layer 26 to the second electrode 23. In other words, a current may flow through the second electrode 23 and the auxiliary electrically-conductive layer 26 in the pixel region 110A. This allows for reduction in resistance of the second electrode 23. In the present example embodiment, the auxiliary electrically-conductive layer 26 may include an organic electrically-conductive material. This makes it easier to increase a thickness of the auxiliary electrically-conductive layer 26, which makes it possible to effectively reduce the resistance of the second electrode 23. Further, this makes it possible to form the auxiliary electrically-conductive layer 26 having a large thickness in a short time by means of a printing method, for example. For example, in a case where the wiring lines are formed with use of a metal material, processes such as masking using a photoresist, etching, and resist stripping are necessary after forming a film of the metal material by means of a method such as a sputtering method. In contrast, using the printing method makes it possible to significantly reduce the number of processes. Alternatively, the auxiliary electrically-conductive layer 26 may be formed by means of a photolithography method. In this case, the auxiliary electrically-conductive layer 26 may be formed with use of an organic photosensitive electrically-conductive material, for example.

The auxiliary electrically-conductive layer 26 may include, for example, an electrically-conductive resin material. In a specific but non-limiting example, the auxiliary electrically-conductive layer 26 may include, for example, an electrically-conductive polymeric material having an aromatic ring. Non-limiting examples of the electrically-conductive polymeric material having an aromatic ring may include polythiophene and polyaniline. Alternative examples of the electrically-conductive resin material may include a low electrically-conductive resin material containing an inorganic electrically-conductive material. The auxiliary electrically-conductive layer 26 may have a thickness of 500 nm to 10 μm, for example.

The auxiliary electrically-conductive section C may have a contact hole of the planarizing film 13, and a bottom surface of the auxiliary electrically-conductive layer 26 may be in contact with a wiring line 12W of the wiring layer 12 via the contact hole of the planarizing film 13. The wiring line 12W may be coupled to, for example, a cathode contact section provided in the peripheral region 110B illustrated in FIG. 1. The cathode contact section may be coupled to a ground potential (GND), for example, as illustrated in FIG. 7, which is described later.

Figure 4:
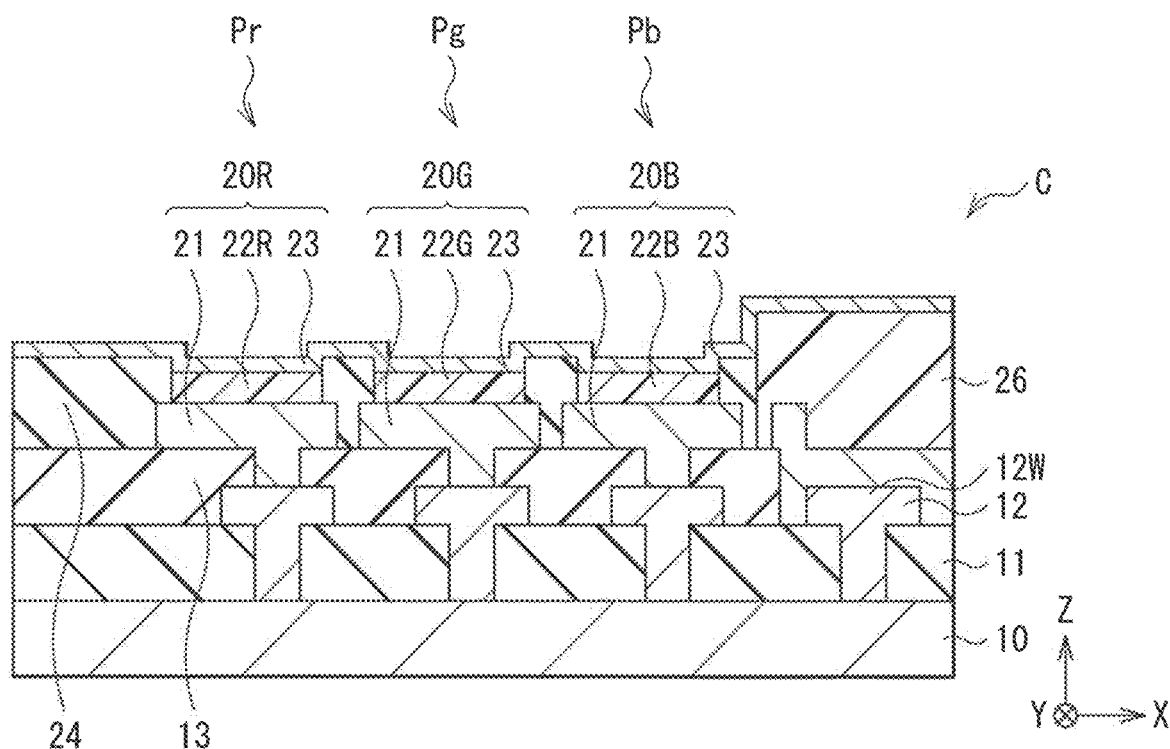
FIG. 4 is a schematic cross-sectional view of another example of an auxiliary electrically-conductive section illustrated in FIG. 3.
Figure 5:
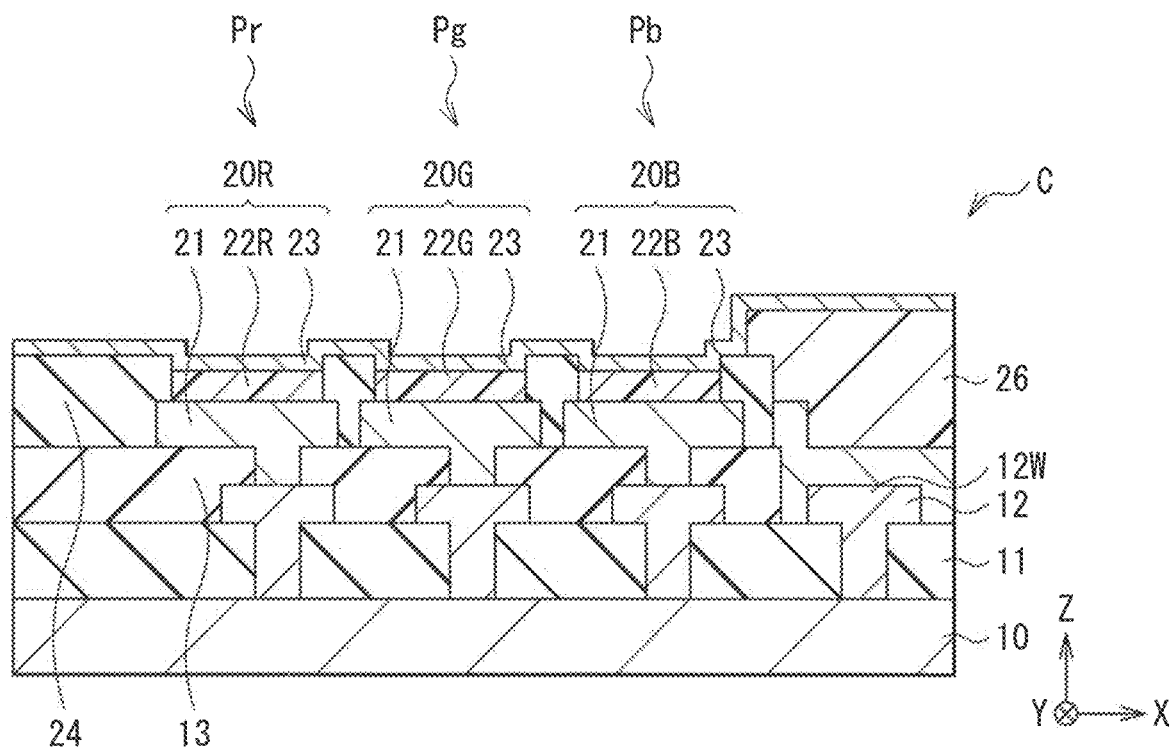
FIG. 5 is a schematic cross-sectional view of yet another example of the auxiliary electrically-conductive section illustrated in FIG. 3.

FIGS. 4 and 5 each illustrate another configuration of the auxiliary electrically-conductive section C. In the auxiliary electrically-conductive section C, the first electrode 21 may be provided between the auxiliary electrically-conductive layer 26 and the wiring line 12W. In other words, the auxiliary electrically-conductive layer 26 may be electrically coupled to the wiring line 12W via the first electrode 21. The auxiliary electrically-conductive layer 26 may be provided on the partition wall 24, and the auxiliary electrically-conductive layer 26 may be in contact with the first electrode 21 in an opening of the partition wall 24, as illustrated in FIG. 5.

The partition wall 24 provided on the first electrodes 21 and on the auxiliary electrically-conductive layer 26 may have openings that cause middle portions of the first electrodes 21 and the auxiliary electrically-conductive layer 26 to be exposed. The partition wall 24 may ensure insulation between the first electrode 21 of each of the organic EL elements 20R, 20G, and 20B and the second electrode 23, and may separate the adjacent pixels pr, pg, and pb from one another. Further, in a manufacturing process, the partition wall 24 may serve as a partition in forming the organic layers 22R, 22G, and 22B by means of a printing method. The partition wall 24 may include, for example, a resin material. Specific but non-limiting examples of the resin material of the partition wall 24 may include photosensitive resins such as an acrylic resin, a polyimide resin, a fluorine resin, a silicone resin, a fluorine polymer, a silicone polymer, a novolac resin, an epoxy resin, and a norbornene resin. Alternatively, the partition wall 24 may include any of these resin materials containing a pigment dispersed therein. The partition wall 24 may have a height of 0.1 μm to 5 μm, for example.

Each of the organic layers 22R, 22G, and 22B provided between the first electrode 21 and the second electrode 23 may include, for example, a hole injection layer, a hole transport layer, the light-emitting layer, an electron transport layer, and an electron injection layer in this order from a position closer to the first electrode 21. At least the light-emitting layers of the organic layer 22R, 22G, and 22B may be formed by means of a printing method, for example, as described later. The organic layers 22R, 22G, and 22B may include, for example, light-emitting layers of different colors. For example, the light-emitting layer of the organic layer 22R, the light-emitting layer of the organic layer 22G, and the light-emitting layer of the organic layer 22B may respectively generate a red color, a green color, and a blue color. The hole injection layers of the organic layers 22R, 22G, and 22B may have the same configuration. The hole transport layers of the organic layers 22R, 22G, and 22B may have the same configuration. The electron transport layers of the organic layers 22R, 22G, and 22B may have the same configuration. The electron injection layers of the organic layers 22R, 22G, and 22B may have the same configuration. The hole injection layer, the hole transport layer, the electron transport layer, and the electron injection layer may be provided common for the pixels pr, pg, and pb.

The hole injection layer may suppress or prevent leakage. The hole injection layer may include hexaazatriphenylene (HAT), for example. The hole injection layer may have a thickness of 1 nm to 20 nm, for example. The hole transport layer may include N,N'-di(1-naphthyl)-N,N'-diphenyl-[1,1'-biphenyl]-4,4'-diamine (α-NPD), for example. The hole transport layer may have a thickness of 15 nm to 100 nm, for example.

The light-emitting layer may be configured to emit light of a predetermined color by recombination of holes and electrons. The light-emitting layer may have a thickness of 5 nm to 50 nm, for example. The light-emitting layer of the organic layer 22R may include rubrene doped with a pyrromethene boron complex, for example. In this situation, rubrene may be used as a host material. The light-emitting layer of the organic layer 22G may include tris(8-hydroxyquinolinato)aluminum (Alq3), for example. The light-emitting layer of the organic layer 22B may include 9,10-di(2-naphthyl)anthracene (ADN) doped with a diamino-chrysene derivative, for example. In this situation, ADN may serve as a host material, and the diamino-chrysene derivative may serve as a dopant material. ADN may be deposited into a thickness of 20 nm, for example, on the hole transport layer. The diamino-chrysene derivative may be doped at a rate of 5% relative to a film thickness.

The electron transport layer may include 2,9-dimethyl-4,7-diphenyl-1,10-phenanthroline (BCP). The electron transport layer may have a thickness of 15 nm to 200 nm, for example. The electron injection layer may include lithium fluoride (LiF), for example. The electron injection layer may have a thickness of 15 nm to 270 nm, for example.

The second electrode 23 opposed to the first electrode with the organic layer 22R, 22G, and 22B in between may serve as a cathode, for example. The second electrode 23 may be provided across the entire pixel region 110A to serve as a common electrode for all the pixels Pix. The second electrode 23 may have light transmissivity with respect to light in wavelength regions generated by the organic layers 22R, 22G, and 22B, i.e., light in a red wavelength region, light in a green wavelength region, and light in a blue wavelength region. The second electrode 23 may be configured by a transparent electrically-conductive film, for example. Non-limiting examples of a material of the transparent electrically-conductive film may include indium tin oxide (ITO), indium zinc oxide (IZO), and a zinc oxide (ZnO)-based material. Non-limiting example of the zinc oxide-based material may include aluminum (Al)-doped zinc oxide (AZO) and gallium (Ga)-doped zinc oxide (GZO). The second electrode 23 may have, for example, a thickness of 1 nm to 10 μm, and the thickness may be determined in view of electrical conductivity and visible-light transmissivity. Alternatively, the second electrode 23 may include an alloy of magnesium and silver (Mg—Ag alloy).

The protective film 25 may cover the second electrode 23. The protective film 25 may include silicon nitride, for example. The protective film 25 may serve as a protective film to suppress or prevent moisture ingress into the organic EL elements 20R, 20G, and 20B and suppress or prevent variation in characteristics such as light emission efficiency of the organic EL elements 20R, 20G, and 20B.

The sealing layer 31 may join the protective film 25 and the counter substrate 30 together and seal the organic EL elements 20R, 20G, and 20B. Non-limiting examples of a material of the sealing layer 31 may include an acrylic resin, a polyimide resin, a fluorine resin, a silicone resin, a fluorine polymer, a silicone polymer, a novolac resin, an epoxy resin, and a norbornene resin. In an alternative example, the sealing layer 31 may include any of these resin materials containing a pigment dispersed therein.

The counter substrate 30 together with the sealing layer 31 may seal the organic EL elements 20R, 20G, and 20B. The counter substrate 30 may include, for example, a material having light transmissivity with respect to light in the wavelength regions generated by the organic layers 22R, 22G, and 22B. The counter substrate 30 may include, for example, a material such as transparent glass and transparent plastic.

The counter substrate 30 may include a color filter layer. The color filter layer may include, for example, a red filter, a green filter, and a blue filter. The color filter layer may be provided on one surface, e.g., a surface on side of the sealing layer 31, of the counter substrate 30, for example. The red filter, the green filter, and the blue filter may be respectively disposed in a region opposed to the pixel pr, a region opposed to the pixel pg, and a region opposed to the pixel pb. The red filter, the green filter, and the blue filter may each include a resin containing a pigment mixed therein.

A black matrix layer may be provided in a region between the red filter, the green filter, and the blue filter described above, i.e., in a region between pixels. The black matrix layer may be configured by a resin film containing a black colorant mixed therein, or a thin film filter utilizing interference of a thin film, for example. The thin-film filter may include, for example, one or more stacked thin films including metal, metal nitride, or metal oxide. The thin-film filter may attenuate light through interference of the thin films. Specific but non-limiting examples of the thin film filter may include a filter in which chromium (Cr) and chromium(III) oxide ($Cr_2O_3$) are stacked alternately.

[Overall Configuration]

Figure 6:
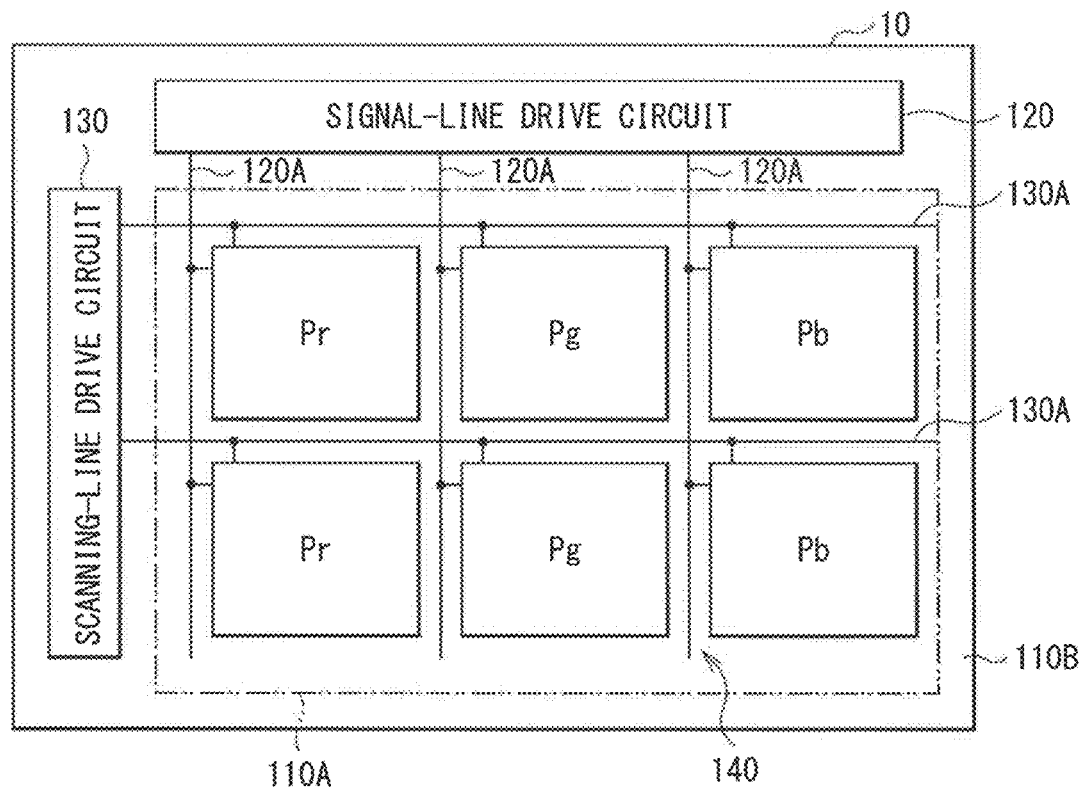
FIG. 6 is a block diagram illustrating an example of a functional configuration of the display unit illustrated in FIG. 1.

FIG. 6 is a block diagram illustrating an example of a functional configuration of the display unit 1. The display unit 1 may include the driving substrate 10 including the pixel region 110A and the peripheral region 110B, as described above. The pixels pr, pg, and pb may be provided in the pixel region 110A, and a signal-line drive circuit 120 and a scanning-line drive circuit 130 may be disposed in the peripheral region 110B. The signal-line drive circuit 120 and the scanning-line drive circuit 130 each correspond to a driver for image display.

A pixel circuit 140 may be provided in the pixel region 110A. FIG. 7 illustrates an example of the pixel circuit 140, i.e., an example of a pixel circuit of the pixels pr, pg, and pb. The pixel circuit 140 may be, for example, an active drive circuit provided in the driving substrate 10. The pixel circuit 140 may include a driving transistor Tr1, a switching transistor Tr2, and a capacitor, i.e., a storage capacitor Cs. The storage capacitor Cs may be provided between the driving transistor Tr1 and switching transistor Tr2. The pixel circuit 140 may further include the organic EL element 20R, 20G, or 20B between a first power line Vcc and a second power line GND. The organic EL element 20R, 20G, or 20B may be coupled in series to the driving transistor Tr1. The driving transistor Tr1 and the switching transistor Tr2 may each be configured by a TFT, for example.

The pixel circuit 140 may include a plurality of signal lines 120A in the column direction, and a plurality of scanning lines 130A in a row direction. An intersection between each of the signal lines 120A and corresponding one of the scanning lines 130A may correspond to one of the pixels pr, pg, and pb. Each of the signal lines 120A may be coupled to the signal-line drive circuit 120, and the signal-line drive circuit 120 may supply an image signal to a source electrode of the switching transistor Tr2 via corresponding one of the signal lines 120A. Each of the scanning lines 130A may be coupled to the scanning-line drive circuit 130, and the scanning-line drive circuit 130 may sequentially supply a scanning signal to a gate electrode of the switching transistor Tr2 via the corresponding one of the scanning lines 130A.

[Manufacturing Method]

Such a display unit 1 may be manufactured as described below with reference to FIGS. 8A to 8E, for example.

Figure 8A:
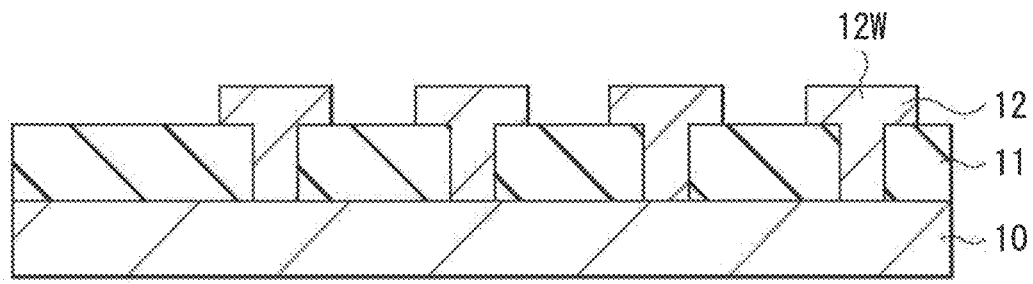
FIG. 8A is a schematic cross-sectional view of one process of a method of manufacturing the display unit illustrated in FIG. 3.

First, the interlayer insulating film 11 and the wiring layer 12 may be formed in this order on the driving substrate 10, as illustrated in FIG. 8A. Contact holes for coupling of the wiring lines of the wiring layer 12 to the driving substrate 10 may be formed in the interlayer insulating film 11.

Figure 8B:
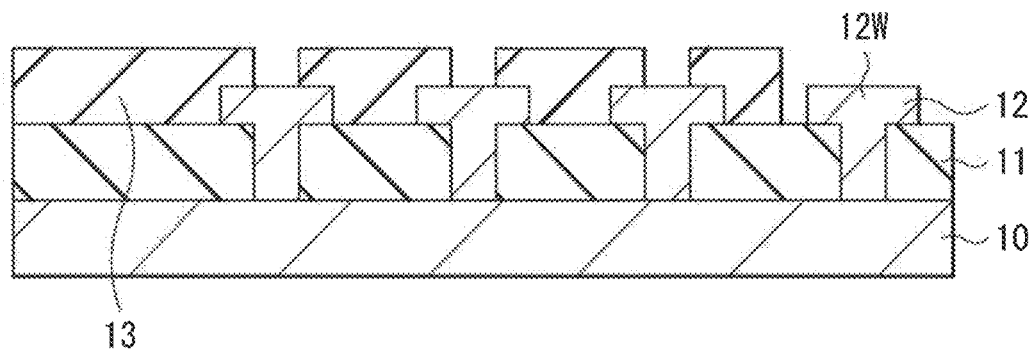
FIG. 8B is a schematic cross-sectional view of a process subsequent to FIG. 8A.

Thereafter, the planarizing film 13 may be formed on the wiring layer 12, as illustrated in FIG. 8B. A silicon oxide film may be formed by means of a chemical vapor deposition (CVD) method to cover the wiring layer 12, and thereafter, an organic insulating layer including a photosensitive material may be formed by means of a spin coating method or a slit coating method, for example, to form the planarizing film 13. Contact holes reaching the wiring lines, which include the wiring line 12W, of the wiring layer 12 may be formed in the planarizing film 13.

Figure 8C:
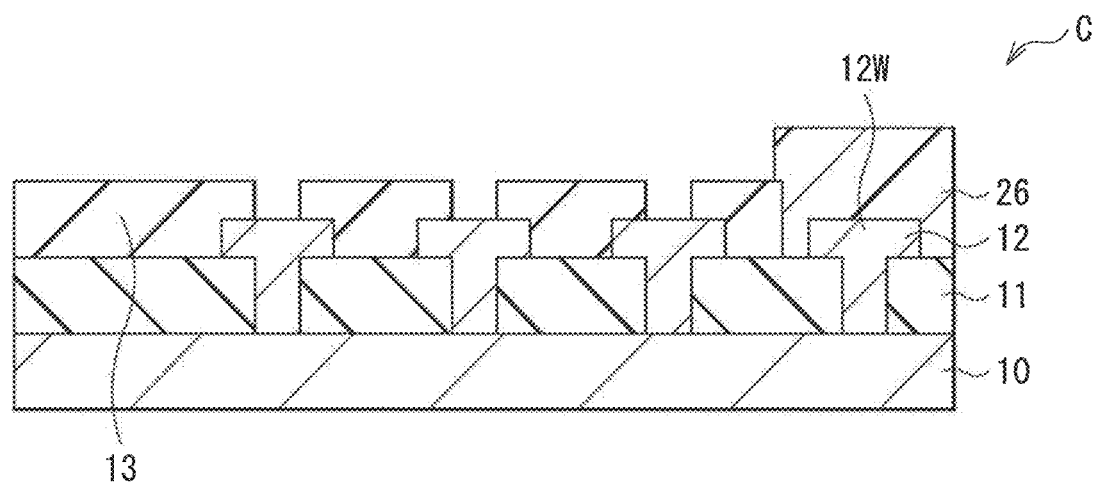
FIG. 8C is a schematic cross-sectional view of a process subsequent to FIG. 8B.

Thereafter, the auxiliary electrically-conductive layer 26 may be formed in a selective region on the planarizing film 13, as illustrated in FIG. 8C. In this situation, the auxiliary electrically-conductive layer 26 may be coupled to the wiring line 12W via corresponding one of the contact holes in the planarizing film 13. The region where the auxiliary electrically-conductive layer 26 is provided may serve as the auxiliary electrically-conductive section C. The auxiliary electrically-conductive layer 26 may be formed by means of a printing method, for example. Alternatively, the auxiliary electrically-conductive layer 26 may be formed by means of a photolithography method.

Figure 8D:
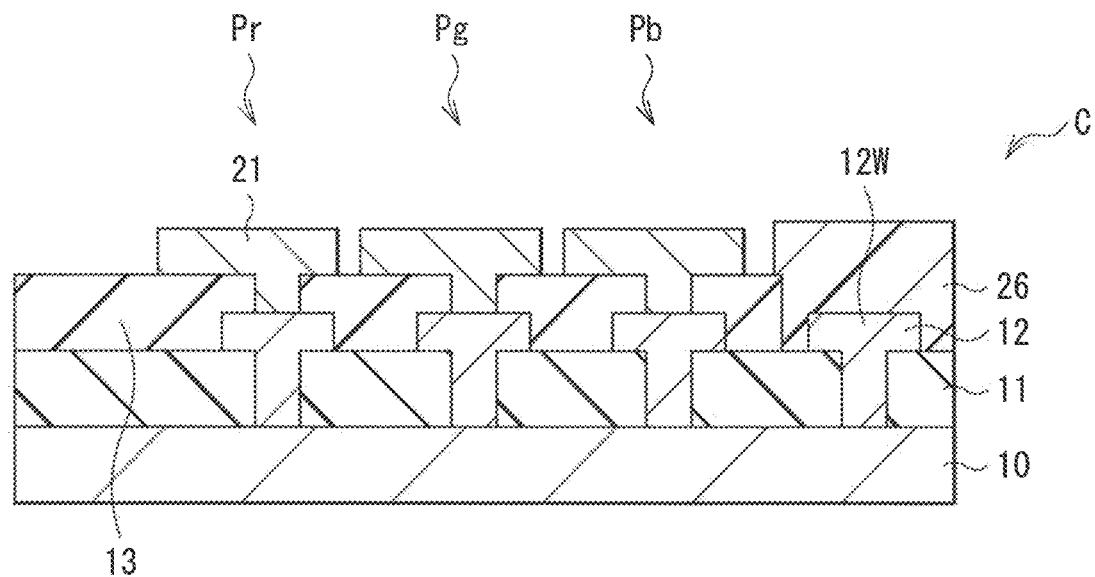
FIG. 8D is a schematic cross-sectional view of a process subsequent to FIG. 8C.

Next, the first electrodes 21 may be formed in regions that are not overlaid on the region where the auxiliary electrically-conductive layer 26 is formed, i.e., in regions where the pixels pr, pg, and pb are formed, as illustrated in FIG. 8D. A film of an electrically-conductive material may be formed by means of a sputtering method, for example, to fill the contact holes provided in the planarizing film 13, and thereafter the film of the electrically-conductive material may be patterned by means of photolithography and etching to form the first electrodes 21.

Figure 8E:
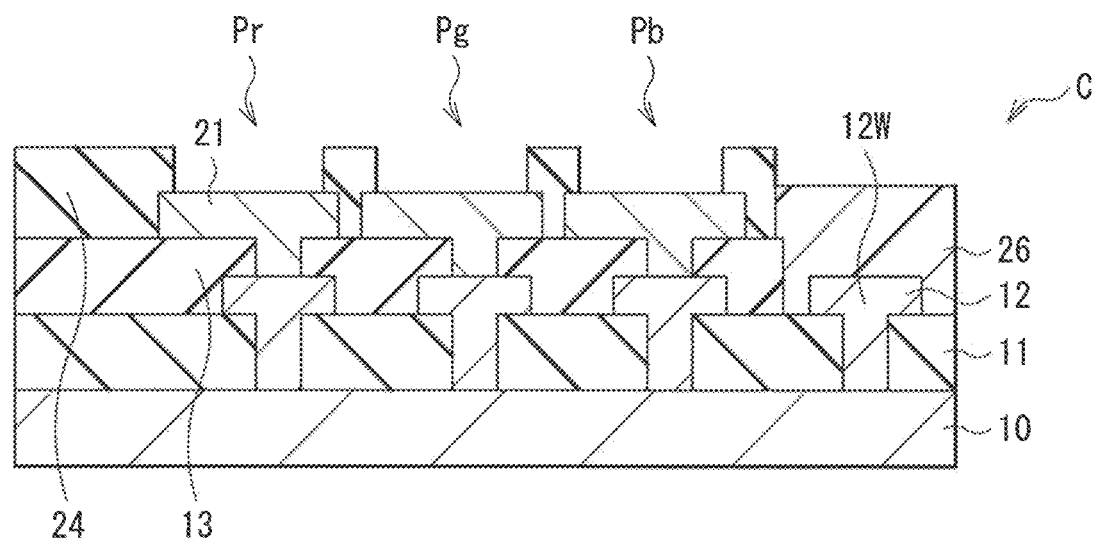
FIG. 8E is a schematic cross-sectional view of a process subsequent to FIG. 8D.

After the formation of the first electrodes 21, the partition wall 24 may be formed on the first electrodes 21, as illustrated in FIG. 8E. The partition wall 24 may have openings that cause the middle portions of the first electrodes 21 and the auxiliary electrically-conductive layer 26 to be exposed.

Thereafter, the organic layers 22R, 22G, and 22B may be formed in regions partitioned by the partition wall 24. The organic layers 22R, 22G, and 22B may be respectively formed in regions where the pixels pr, pg, and pb are to be formed, for example. The organic layers 22R, 22G, and 22B may be formed using the constituent materials of the organic layers 22R, 22G, and 22B by means of a printing method such as an ink-jetting method. Alternatively, the organic layers 22R, 22G, and 22B may be formed by means of a printing method using a dispenser, for example. In an example embodiment, at least the light-emitting layers of the organic layers 22R, 22G, and 22B may be formed by means of a printing method. In other words, in an example embodiment, each of the light-emitting layers may be a printed layer. This makes it possible to facilitate upsizing of the display unit 1, for example.

After the formation of the organic layers 22R, 22G, and 22B, the second electrode 23 including the above-described material may be formed on the organic layers 22R, 22G, and 22B and on the auxiliary electrically-conductive layer 26 by means of a sputtering method, for example. Next, the protective film 25 may be formed on the second electrode 23 by means of a CVD method, for example. Thereafter, the counter substrate 30 may be joined onto the sealing layer 31 provided on the protective film 25. For example, the color filter layer may be formed in the counter substrate 30 in advance. Thus, the display unit 1 is manufactured.

Figure 9A:
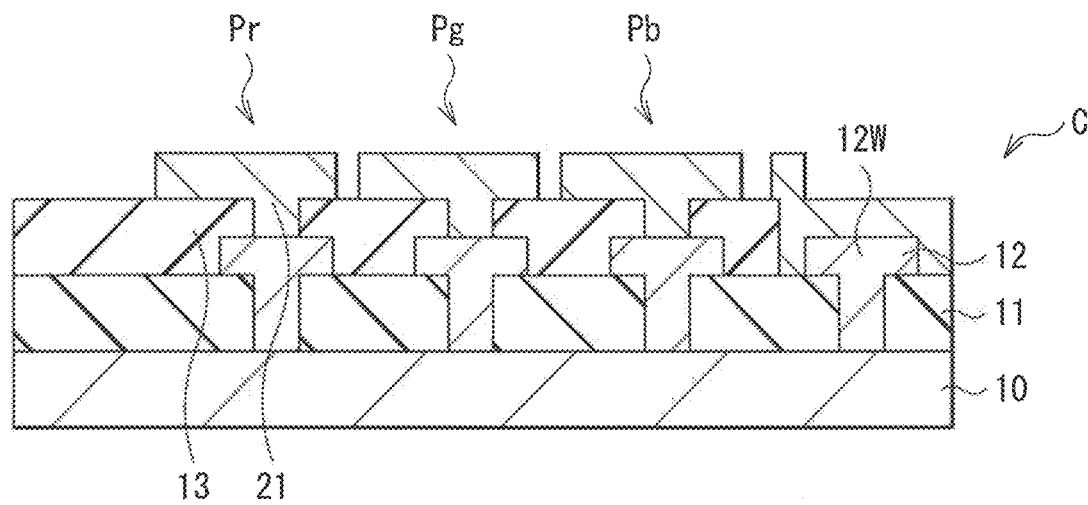
FIG. 9A is a schematic cross-sectional view of another example of one process of the method of manufacturing the display unit illustrated in FIG. 3.
Figure 9B:
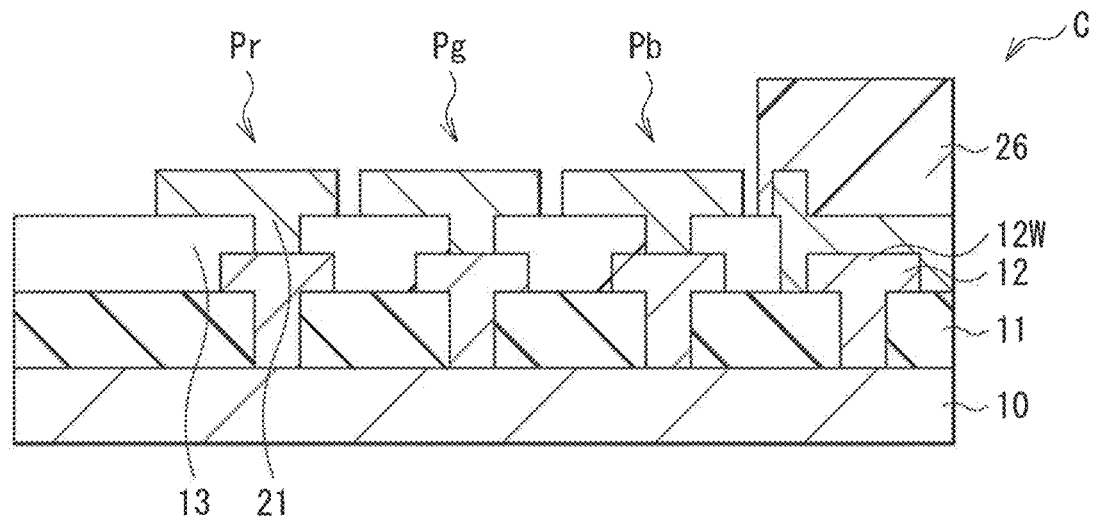
FIG. 9B is a schematic cross-sectional view of a process subsequent to FIG. 9A.
Figure 9C:
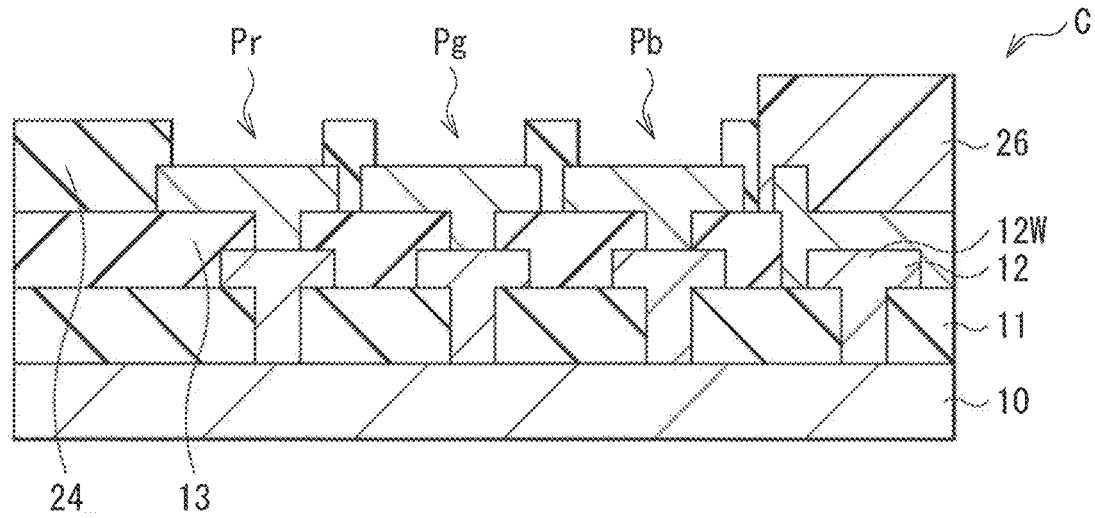
FIG. 9C is a schematic cross-sectional view of a process subsequent to FIG. 9B.

In an alternative embodiment, the auxiliary electrically-conductive layer 26 may be formed after the formation of the first electrodes 21, as illustrated in FIGS. 9A to 9C. In a specific but non-limiting example, the auxiliary electrically-conductive layer 26 may be formed as described below.

First, the interlayer insulating film 11, the wiring layer 12, and the planarizing film 13 may be formed in this order on the driving substrate 10.

Next, the first electrodes 21 may be formed on the planarizing film 13, as illustrated in FIG. 9A. In this situation, the first electrodes 21 may be formed in a region where the auxiliary electrically-conductive section C is to be formed, as well as in the regions where the pixels pr, pg, and pb are to be formed.

After the formation of the first electrode 21, the auxiliary electrically-conductive layer 26 may be formed in the region where the auxiliary electrically-conductive section C is to be formed, as illustrated in FIG. 9B. Thereafter, the partition wall 24 may be formed, as illustrated in FIG. 9C. Processes subsequent to the formation of the partition wall 24 may be similar to those described above. Thus, the display unit 1 may be manufactured.

Figure 10A:
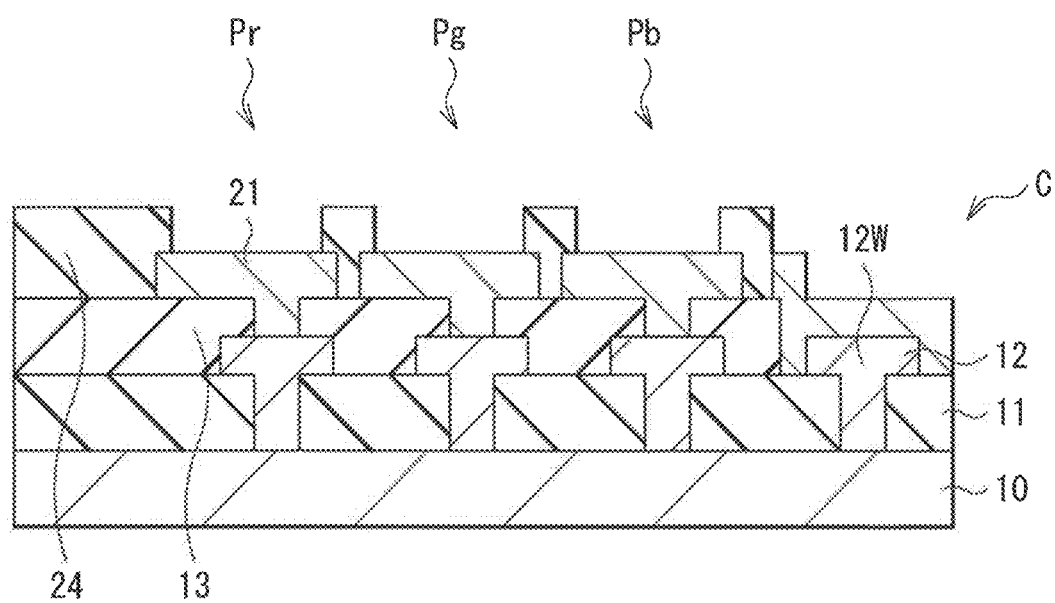
FIG. 10A is a schematic cross-sectional view of yet another example of one process of the method of manufacturing the display unit illustrated in FIG. 3.
Figure 10B:
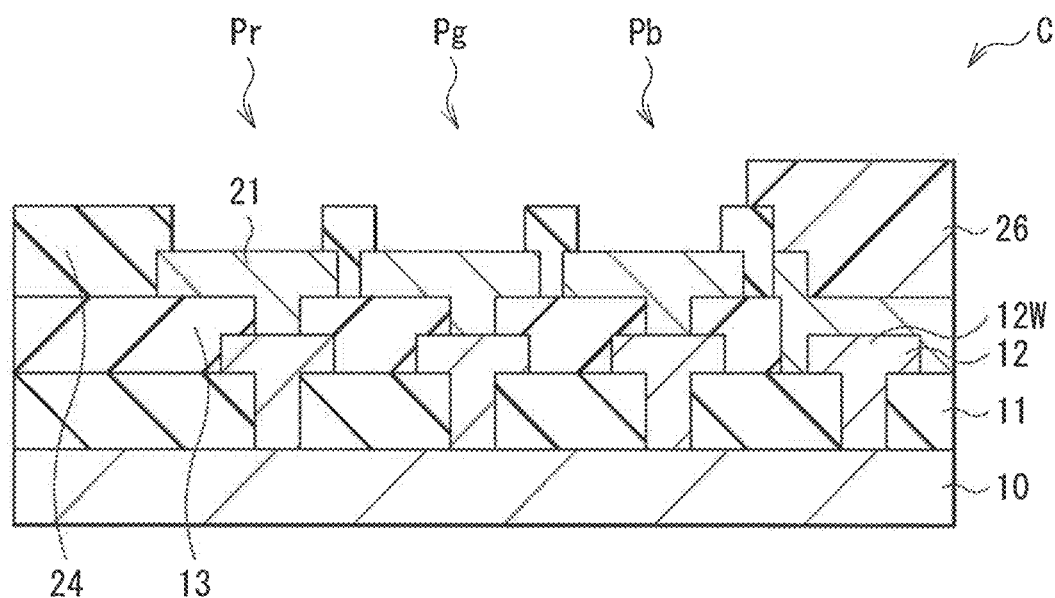
FIG. 10B is a schematic cross-sectional view of a process subsequent to FIG. 10A.

In an alternative embodiment, the auxiliary electrically-conductive layer 26 may be formed after the formation of the partition wall 24, as illustrated in FIGS. 10A and 10B. In a specific but non-limiting example, the auxiliary electrically-conductive layer 26 may be formed as described below.

First, the interlayer insulating film 11, the wiring layer 12, the planarizing film 13, and the first electrodes 21 may be formed in this order on the driving substrate 10, as illustrated in FIG. 9A. In this situation, the first electrodes 21 may be formed in the region where the auxiliary electrically-conductive section C is to be formed, as well as in the regions where the pixels pr, pg, and pb are to be formed.

Next, the partition wall 24 may be formed on the first electrodes 21, as illustrated in FIG. 10A. Next, the auxiliary electrically-conductive layer 26 may be formed in the region where the auxiliary electrically-conductive section C is to be formed, as illustrated in FIG. 10B. Thereafter, the organic layers 22R, 22G, and 22B may be respectively formed in the regions where the pixels pr, pg, and pb are to be formed. Processes subsequent to the formation of the organic layers 22R, 22G, and 22B may be similar to those described above. Thus, the display unit 1 may be manufactured.

Figure 11:
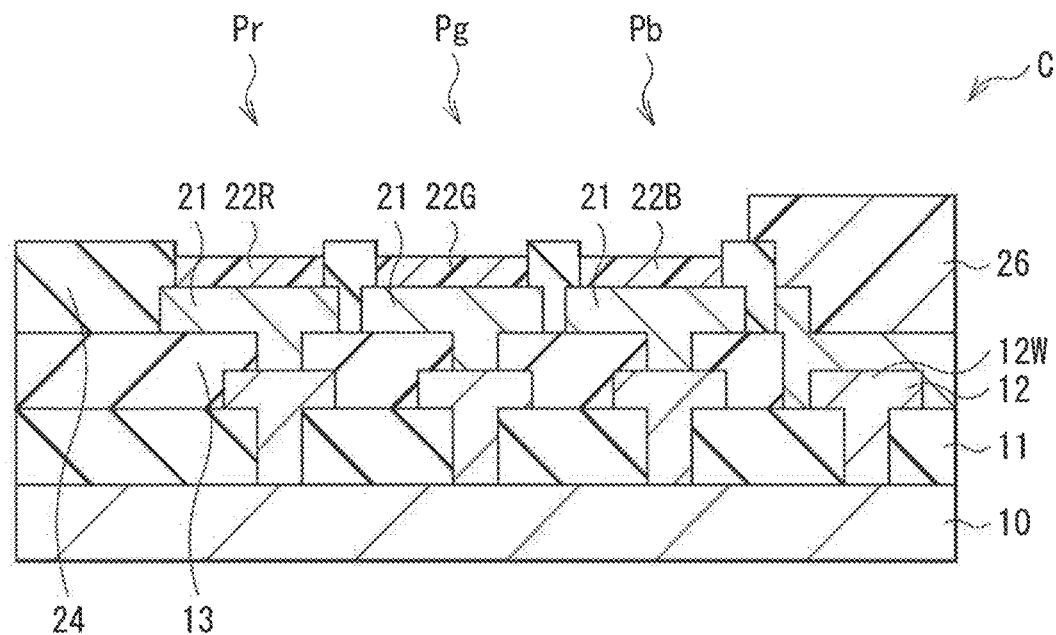
FIG. 11 is a schematic cross-sectional view of another example of the process subsequent to FIG. 10A.

The auxiliary electrically-conductive layer 26 together with the organic layers 22R, 22G, and 22B may be formed after the formation of the partition wall 24, as illustrated in FIG. 11. In a specific but non-limiting example, the auxiliary electrically-conductive layer 26 may be formed as described below.

First, as described above with reference to FIG. 10A, the partition wall 24 may be formed on the first electrodes 21. Thereafter, as illustrated in FIG. 11, the organic layers 22R, 22G, and 22B may be respectively formed in the regions where the pixels pr, pg, and pb are to be formed, and the auxiliary electrically-conductive layer 26 may be formed in the region where the auxiliary electrically-conductive section C is to be formed. The organic layers 22R, 22G, and 22B, and the auxiliary electrically-conductive layer 26 may be formed by means of a printing method, for example. In other words, the auxiliary electrically-conductive layer 26 may be a printed layer. After the formation of the organic layers 22R, 22G, and 22B and the auxiliary electrically-conductive layer 26, the display unit 1 may be manufactured in a manner similar to those described above.

[Operation]

In the display unit 1, the scanning-line drive circuit 130 may supply a selection pulse to the switching transistor Tr2 of each of the pixels pr, pg, and pb to select the pixels pr, pg, and pb. The signal-line drive circuit 120 may supply, to each of the selected pixels pr, pg, and pb, a signal voltage corresponding to an image signal, and the storage capacitor Cs may store the supplied signal voltage. The driving transistor Tr1 may be subjected to ON/OFF control in response to the signal stored in the storage capacitor Cs to feed a driving current to the organic EL elements 20R, 20G, and 20B. This may cause the organic EL elements 20R, 20G, and 20B, i.e., the light-emitting layers of the organic layers 22R, 22G, and 22B to emit light by recombination of holes and electrons. The light may be extracted from each of the pixels pr, pg, and pb through the second electrode 23, the protective film 25, the sealing layer 31, and the counter substrate 30, for example. This causes the pixels pr, pg, and pb to respectively emit a red light beam, a green light beam, and a blue light beam, and additive color mixture of the light beams allows color image display to be performed.

[Workings and Effects]

In the present example embodiment, the auxiliary electrically-conductive layer 26 may be provided in the pixel region 110A, thus causing the auxiliary electrically-conductive layer 26 to be electrically coupled to the second electrode 23 in the auxiliary electrically-conductive section C near the pixels pr, pg, and pb. This causes a current to flow through the second electrode 23 and the auxiliary electrically-conductive layer 26 in the pixel region 110A, which makes it possible to reduce the resistance of the second electrode 23. The workings and effects are described below.

Figure 12:
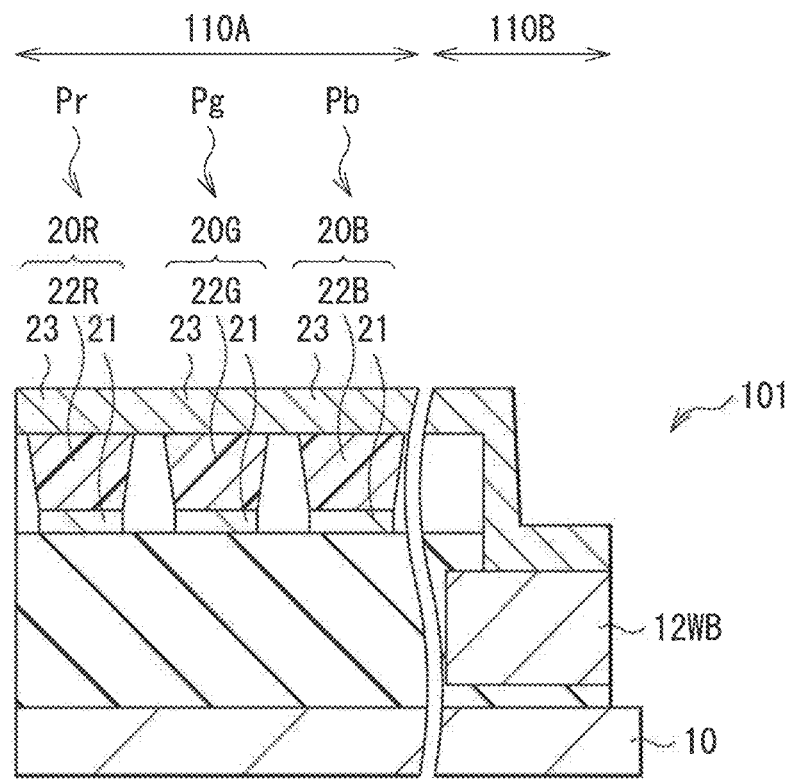
FIG. 12 is a schematic cross-sectional view of a configuration of a main part of a display unit according to Comparative Example 1.

FIG. 12 illustrates a schematic cross-sectional configuration of a main part of a display unit, i.e., a display unit 101 according to Comparative Example 1. The display unit 101 is of a top-emission type as with the display unit 1, and includes the second electrode 23 configured by a transparent electrically-conductive film. In the display unit 101, the second electrode 23 provided across the entire pixel region 110A is coupled to a wiring line 12WB in the peripheral region 110B.

The second electrode 23 includes an inorganic material. Hence, increasing the thickness of the second electrode 23 results in a longer film formation time and a decline in yields. Further, increasing the thickness of the second electrode 23 results in reduction in transmissivity and light extraction efficiency. Accordingly, it is difficult to increase the thickness of the second electrode 23. Hence, sheet resistance of the second electrode 23 is increased. The second electrode 23 having high sheet resistance may cause an increase in power consumption. Further, in the display unit 101, the second electrode 23 is coupled to the wiring line 12WB in the peripheral region 110B. This easily causes an uneven light emission state in the pixel region 110A for the following reason. In the display unit 101, the wiring line 12WB is provided in the peripheral region 110B, which causes all currents in the pixel region 110A to flow through the peripheral region 110B via the second electrode 23. This increases a difference in resistance of the wiring lines of the second electrode 23 between the pixels pr, pg, and pb located in a central portion of the pixel region 110A and the pixels pr, pg, and pb located in a portion closer to the peripheral region 110B.

Figure 13:
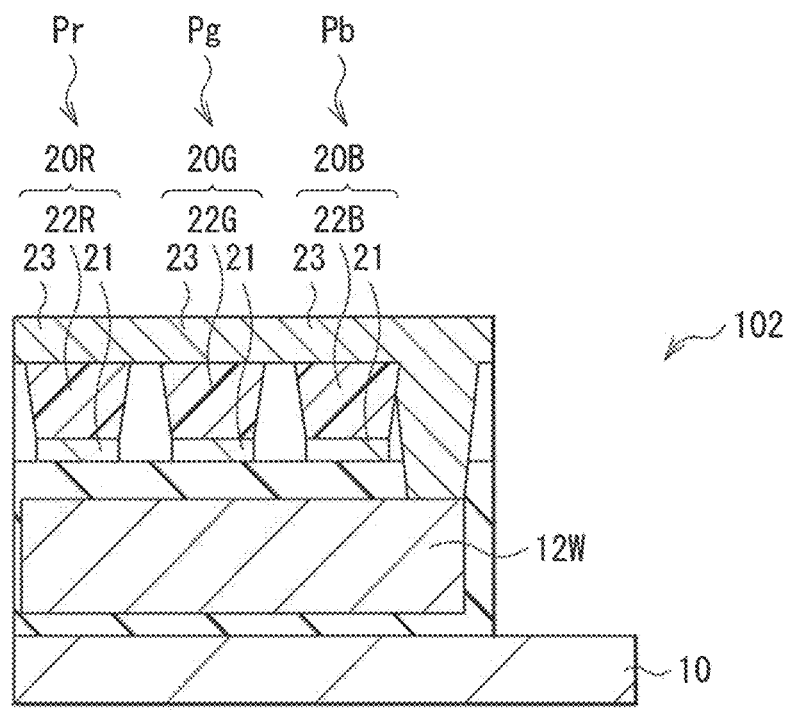
FIG. 13 is a schematic cross-sectional view of a configuration of a main part of a display unit according to Comparative Example 2.
Figure 14:
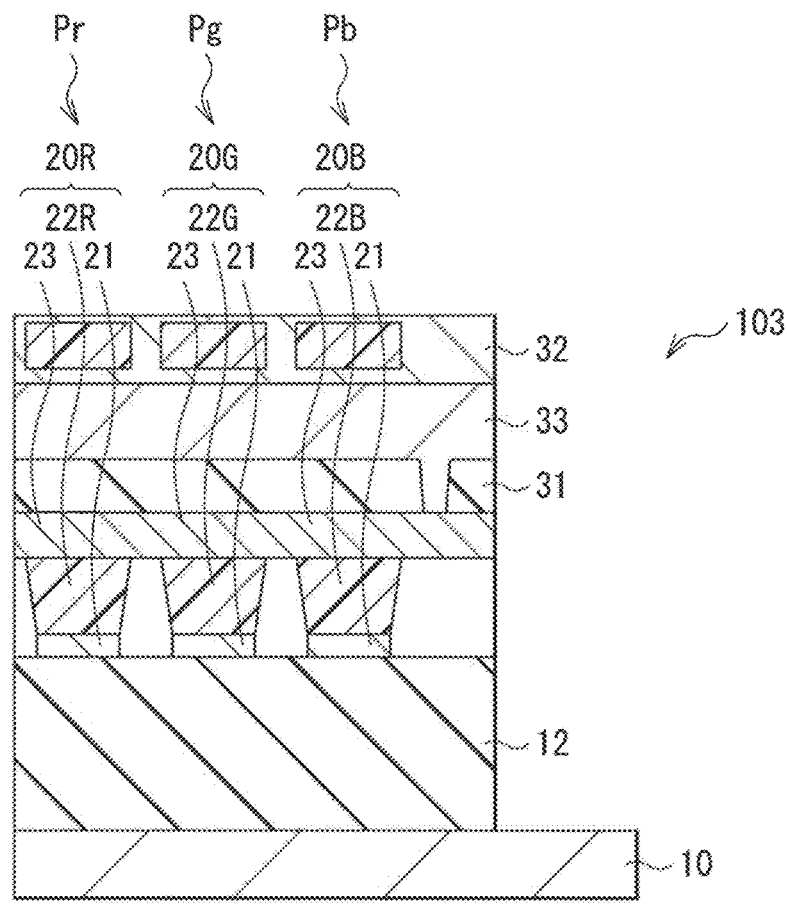
FIG. 14 is a schematic cross-sectional view of a configuration of a main part of a display unit according to Comparative Example 3.

FIGS. 13 and 14 respectively illustrate cross-sectional configurations of main parts of display units, i.e., display units 102 and 103 according to Comparative Examples 2 and 3. In the display unit 102 according to Comparative Example 2 illustrated in FIG. 13, in order to reduce the resistance of the second electrode 23, the second electrode 23 is coupled to the wiring line 12W in the pixel region 110A. In the display unit 103 according to Comparative Example 3 illustrated in FIG. 14, in order to reduce the resistance of the second electrode 23, the second electrode 23 is coupled to an electrically-conductive film 33 in the pixel region 110A. In such display units 102 and 103, the second electrode 23 is coupled to the wiring line 12W and the electrically-conductive film 33, respectively, in the pixel region 110A, which makes it possible to suppress an increase in power consumption and variation in the light emission state among positions in the pixel region 110A.

In the display unit 102, a metal mask is used to directly couple, to the wiring line 12W, the second electrode 23 formed by means of a vapor deposition method, for example. However, it is difficult to upsize the display unit 102 by means of this method. Further, the second electrode 23 includes an inorganic material, which makes it difficult to increase the thickness of the second electrode 23, as described above.

In the display unit 103, the second electrode 23 is coupled to the electrically-conductive film 33 provided between a color filter layer 32 and the sealing layer 31, which makes it necessary to provide a through electrode in a layer such as the sealing layer 31. Providing the through electrode causes an increase in cost and a decline in yields.

In contrast, in the present example embodiment, the auxiliary electrically-conductive layer 26 including the organic electrically-conductive material is provided in the pixel region 110A, and the second electrode 23 is coupled to the auxiliary electrically-conductive layer 26. It is possible to form the auxiliary electrically-conductive layer 26 including the organic electrically-conductive material by means of a printing method, for example, thereby facilitating upsizing of the display unit 1. Further, it is possible to easily increase the thickness of the auxiliary electrically-conductive layer 26 including the organic electrically-conductive material, thereby effectively reducing the resistance of the second electrode 23.

Further, the auxiliary electrically-conductive layer 26 may be provided between the second electrode 23 and the wiring layer 12, i.e., the wiring line 12W, which eliminates necessity of a component such as the through electrode and makes it possible to easily couple the auxiliary electrically-conductive layer 26 to the wiring line 12W. This makes it possible to suppress an increase in cost and a decline in yields.

As described above, in the display unit 1, the second electrode 23 is electrically coupled to the auxiliary electrically-conductive layer 26 in the auxiliary electrically-conductive section C near the pixels pr, pg, and pb, which allows a current to flow through the second electrode 23 and the auxiliary electrically-conductive layer 26 in the pixel region 110A. This makes it possible to reduce the resistance of the second electrode 23. Accordingly, it is possible to suppress an increase in power consumption and variation in the light emission state among positions in the pixel region 110A.

Moreover, the auxiliary electrically-conductive layer 26 includes the organic electrically-conductive material, which makes it possible to easily increase the thickness of the auxiliary electrically-conductive layer 26. This makes it possible to effectively reduce the resistance of the second electrode 23. Further, it is possible to form the auxiliary electrically-conductive layer 26 by means of a printing method, for example, thereby facilitating upsizing of the display unit 1.

In addition, a component such as the through electrode is unnecessary for coupling between the auxiliary electrically-conductive layer 26 and the wiring line 12W. This makes it possible to suppress an increase in cost and a decline in yields that are caused by the component such as the through electrode.

Description is given below of modification examples of the foregoing first example embodiment and another example embodiment. In the following description, the same components as those of the foregoing example embodiment are denoted with the same reference numerals, and descriptions thereof are omitted where appropriate.

2. Modification Example 1

Figure 15:
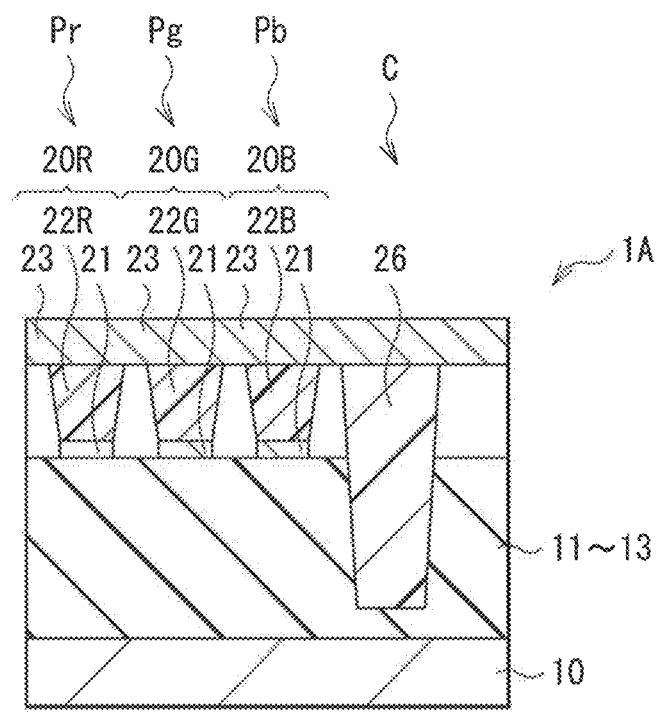
FIG. 15 is a schematic cross-sectional view of a configuration of a main part of a display unit according to Modification Example 1.

FIG. 15 schematically illustrates a cross-sectional configuration of a main part of a display unit, i.e., a display unit 1A according to Modification Example 1 of the foregoing first example embodiment. In the display unit 1A, the auxiliary electrically-conductive layer 26 is not coupled to the wiring line of the wiring layer 12. In the display unit 1A, for example, the second electrode 23 may be coupled to a cathode contact section provided in the peripheral region 110B. Except this point, the display unit 1A has a configuration similar to that of the display unit 1 according to the foregoing example embodiment, and workings and effects thereof are also similar.

3. Modification Example 2

Figure 16:
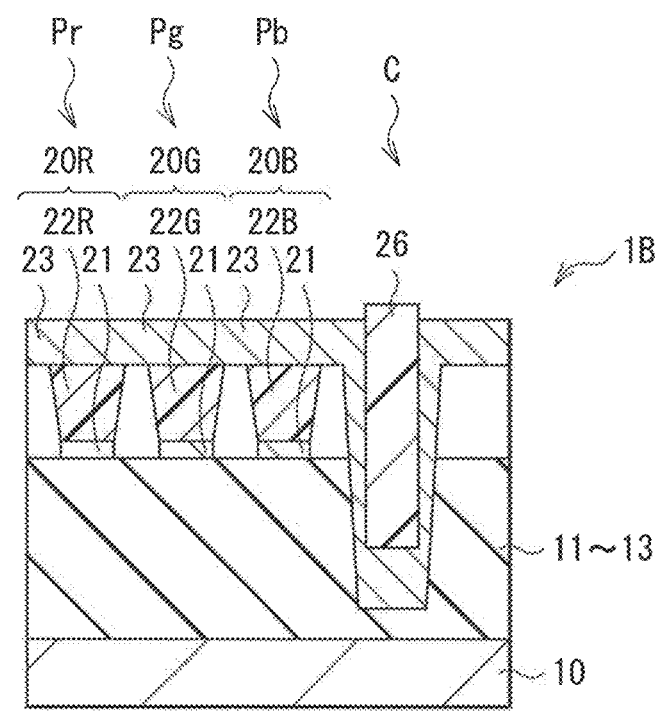
FIG. 16 is a schematic cross-sectional view of a configuration of a main part of a display unit according to Modification Example 2.

FIG. 16 schematically illustrates a cross-sectional configuration of a main part of a display unit, i.e., a display unit 1B according to Modification Example 2 of the foregoing first example embodiment. In the auxiliary electrically-conductive section C of the display unit 1B, the second electrode 23 and the auxiliary electrically-conductive layer 26 may be provided in this order on the driving substrate 10. For example, the second electrode 23 and the auxiliary electrically-conductive layer 26 may be provided in this order in a recess provided in the auxiliary electrically-conductive section C, and a bottom surface and a side surface of the auxiliary electrically-conductive layer 26 may be in contact with the second electrode 23. Except this point, the display unit 1B has a configuration similar to that of the display unit 1 according to the foregoing example embodiment, and workings and effects thereof are also similar.

In the display unit 1B, for example, the second electrode 23 may be coupled to the cathode contact section provided in the peripheral region 110B. In an alternative embodiment, the second electrode 23 may be coupled to the wiring line of the wiring layer 12 in the auxiliary electrically-conductive section C.

4. Modification Example 3

The auxiliary electrically-conductive layer 26 of any of the above-described display units 1, 1A, and 1B illustrated in FIGS. 3, 15, and 16 may have light transmissivity with respect to light in a wavelength region generated by the light-emitting layer. This makes it possible for the display units 1, 1A, and 1B to serve as a transparent display. In the display units 1, 1A, and 1B, for example, an image may be displayed when the organic EL elements 20R, 20G, and 20B emit light, and externally received light may be transmitted from the driving substrate 10 to the counter substrate 30 when the organic EL elements 20R, 20G, and 20B do not emit light. In other words, when the organic EL elements 20R, 20G, and 20B do not emit light, it is possible to see through side of a back surface of the driving substrate 10.

The auxiliary electrically-conductive layer 26 may include, for example, an organic electrically-conductive material having light transmissivity with respect to light of a wavelength in a visible region. Non-limiting examples of such an organic transparent electrically-conductive material may include an electrically-conductive polymeric material having an aromatic ring. Non-limiting examples of the electrically-conductive polymeric material having an aromatic ring may include polythiophene and polyaniline. Alternative examples of the organic electrically-conductive material may include a low transparent electrically-conductive resin material containing an inorganic transparent electrically-conductive material.

In the display units 1, 1A, and 1B each configuring a transparent display, the wiring lines, including the wiring line 12W, of the wiring layer 12 and the first electrode 21 may include a transparent electrically-conductive material. For example, the first electrode 21 including the transparent electrically-conductive material allows for an increase in light transmittance when the organic EL elements 20R, 20G, and 20B do not emit light.

4. Second Example Embodiment

Figure 17:
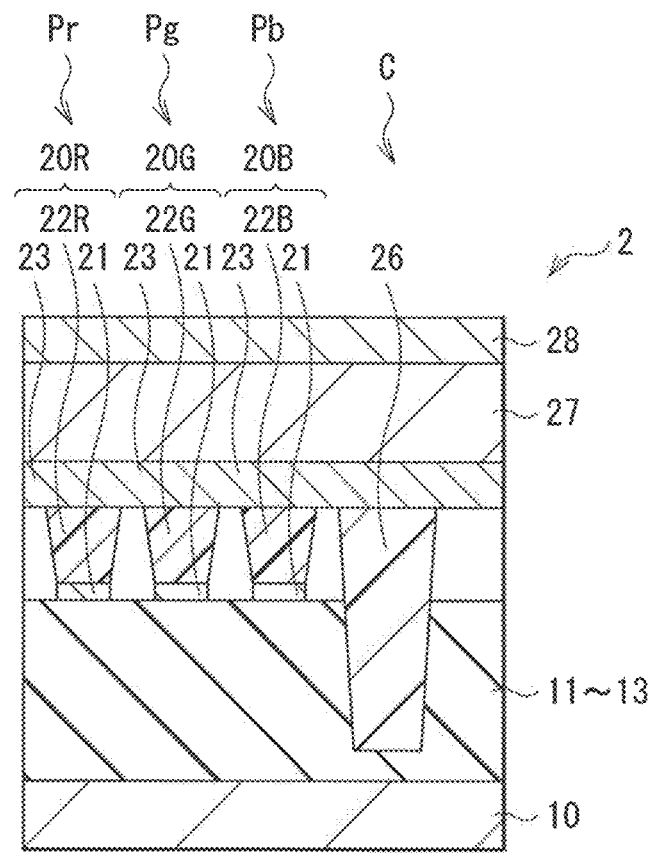
FIG. 17 is schematic cross-sectional view of a configuration of a main part of a display unit according to one example embodiment of the disclosure.

FIG. 17 illustrates a cross-sectional configuration of a main part of a display unit, i.e., a display unit 2 according to a second example embodiment of the disclosure. The display unit 2 may be of a bottom emission type, and light generated by the light-emitting layer may be extracted from side of the driving substrate 10. In other words, in the display unit 2, the first electrode 21 may have light transmissivity with respect to light in a wavelength region generated by the light-emitting layer. The display unit 2 of the bottom-emission type may include the auxiliary electrically-conductive layer 26.

As with the description in the foregoing Modification Example 3, the display unit 2 may configure a transparent display. In this situation, the auxiliary electrically-conductive layer 26 may have, for example, light transmissivity with respect to light of a wavelength in the visible region, and may include an organic transparent electrically-conductive material.

The auxiliary electrically-conductive section C may include the auxiliary electrically-conductive layer 26 and the second electrode 23 in this order from side of the driving substrate 10. The auxiliary electrically-conductive layer 26 may not be coupled to the wiring line of the wiring layer 12, or may be coupled to the wiring line, e.g., the wiring line 12W illustrated in FIG. 3, of the wiring layer 12. The auxiliary electrically-conductive section C may include the second electrode 23 and the auxiliary electrically-conductive layer 26 in this order from side of the driving substrate 10, as illustrated in FIG. 16.

The display unit 2 may perform switching between a transparent display mode and a black display mode, for example. The display unit 2 may include, on the second electrode 23, a light adjustment film 27 and an electrically-conductive film 28. The light adjustment film 27 and the electrically-conductive film 28 may be opposed to the driving substrate 10 with the second electrode 23 in between, and may be provided across the entire pixel region 110A, for example.

The light adjustment film 27 provided between the second electrode 23 and the electrically-conductive film 28 may perform switching between the transparent display mode and the black display mode, and may reversibly change between an opaque state, e.g., a black state and a transparent state. The light adjustment film 27 may be a functional film that instantaneously performs switching between the opaque state and the transparent state in response to ON/OFF operations of the second electrode 23 and the electrically-conductive film 28. A material of the light adjustment film 27 may undergo an oxidation-reduction reaction to electrochemically change an optical state of the light adjustment film 27. In an alternative embodiment, orientation of particles in the light adjustment film 27 may be electrically controlled to control transmission and scattering of light, thereby adjusting light transmittance of the light adjustment film 27. The electrically-conductive film 28 opposed to the second electrode 23 with the light adjustment film 27 in between may apply a voltage to the light adjustment film 27, and may have light transmissivity with respect to light in a wavelength region generated by the light-emitting layer. The electrically-conductive film 28 may include, for example, an inorganic transparent electrically-conductive material.

For example, in the black display mode, the light adjustment film 27 may be changed to the black state, and the organic EL elements 20R, 20G, and 20B may emit light. Thus, an image may be displayed. For example, in the transparent display mode, the light adjustment film 27 may be changed to the transparent mode, and the organic EL elements 20R, 20G, and 20B may not emit light. Thus, externally received light may be transmitted from the counter substrate 30 to the driving substrate 10, and it is possible to see through the side of a back surface of the counter substrate 30.

5. Application Example (Electronic Apparatus)

Figure 18:
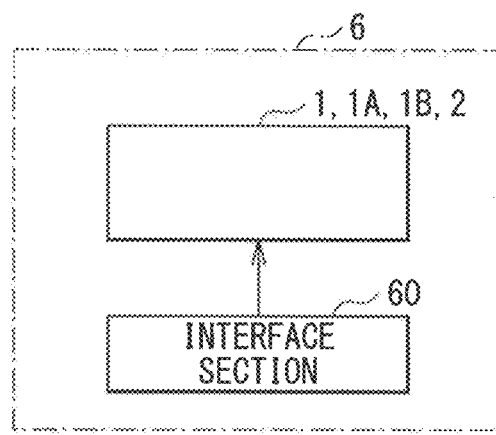
FIG. 18 is a block diagram illustrating a configuration of an electronic apparatus.

The display units 1, 1A, 1B, and 2 according to the foregoing example embodiments and modification examples are applicable to a variety of electronic apparatuses. FIG. 18 illustrates a functional block configuration of an electronic apparatus 6. Non-limiting examples of the electronic apparatus 6 may include televisions, personal computers (PCs), smartphones, tablet PCs, mobile phones, digital still cameras, and digital video cameras.

The electronic apparatus 6 may include, for example, any of the above-described display units 1, 1A, 1B, and 2, and an interface section 60. The interface section 60 may be an input section that receives various external signals and external electric power. Optionally, the interface section 60 may include, for example, a user interface such as a touch panel, a keyboard, or operation buttons.

Although description has been given hereinabove with reference to the example embodiments and the modification examples, the technology is not limited thereto, but may be modified in a wide variety of ways. For example, factors such as a material and a thickness of each layer, and a film-forming method as well as a film-forming condition exemplified in the foregoing example embodiment, etc. are illustrative and non-limiting. Any other material, any other thickness, any other film-forming method, any other film-forming condition, and any other factor may be adopted besides those described above.

Further, the organic layer 22R, 22G, and 22B may each include at least the light-emitting layer. For example, the organic layers 22R, 22G, and 22B may each include only the light-emitting layer.

Although the description has been given, in the foregoing example embodiments, etc., of the case of the display unit of an active-matrix type, the disclosure is also applicable to a display unit of a passive-matrix type. The configuration of the pixel circuit 140 for active-matrix driving is not limited to that described herein and may include additional capacitors and transistors as needed. In this case, in addition to the scanning-line drive circuit 130 and the signal-line drive circuit 120, any other necessary driving circuit may be added depending on alternation in the pixel circuit 140.

Although FIG. 2 illustrates an example of arrangement of the auxiliary electrically-conductive section C, the arrangement of the auxiliary electrically-conductive section C is not limited thereto.

The effects described in the foregoing example embodiments are mere examples. The effects according to an embodiment of the disclosure may be other effects, or may further include other effects in addition to the effects described hereinabove.

It is to be noted that the technology may also have the following configurations.

(1)

A display unit including:

a substrate including a pixel region including a plurality of pixels and a peripheral region outside the pixel region;

a first electrode provided for each of the plurality of pixels in the pixel region on the substrate;

a second electrode opposed to the first electrode and provided common for the plurality of pixels;

an organic layer provided between the second electrode and the first electrode and including a light-emitting layer; and an auxiliary electrically-conductive layer including an organic electrically-conductive material, the auxiliary electrically-conductive layer being disposed in the pixel region on the substrate and electrically coupled to the second electrode.

(2)

The display unit according to (1), in which the pixels each include the first electrode, the organic layer, and the second electrode in this order on the substrate, and the pixel region includes, together with the pixels, an auxiliary electrically-conductive section including the auxiliary electrically-conductive layer and the second electrode on the substrate.

(3)

The display unit according to (2), in which the auxiliary electrically-conductive section is disposed at a position not overlaid on the pixels.

(4)

The display unit according to (2) or (3), in which the auxiliary electrically-conductive section includes the auxiliary electrically-conductive layer and the second electrode in this order on the substrate.

(5)

The display unit according to (2) or (3), in which the auxiliary electrically-conductive section includes the second electrode and the auxiliary electrically-conductive layer in this order on the substrate.

(6)

The display unit according to any one of (2) to (5), further including a wiring layer provided between the substrate and the first electrode and including a plurality of wiring lines, the auxiliary electrically-conductive layer being electrically coupled to corresponding one of the wiring lines.

(7)

The display unit according to (6), in which the auxiliary electrically-conductive layer is in contact with the corresponding one of the wiring lines in the auxiliary electrically-conductive section.

(8)

The display unit according to any one of (2) to (7), in which the auxiliary electrically-conductive section is provided in a band-like shape in the pixel region.

(9)

The display unit according to any one of (1) to (8), in which each of the light-emitting layer and the auxiliary electrically-conductive layer is a printed layer.

(10)

The display unit according to any one of (1) to (9), in which the second electrode has light transmissivity with respect to light in a wavelength region generated by the light-emitting layer.

(11)

The display unit according to any one of (1) to (10), in which the auxiliary electrically-conductive layer has light transmissivity with respect to light in a wavelength region generated by the light-emitting layer.

(12)

The display unit according to any one of (1) to (11), in which each of the first electrode and the second electrode has light transmissivity with respect to light in a wavelength region generated by the light-emitting layer.

(13)

The display unit according to any one of (1) to (12), further including a light adjustment film opposed to the substrate with the second electrode in between, the light adjustment film reversibly changing between a black state and a transparent state.

In the display unit according to one embodiment of the disclosure, the auxiliary electrically-conductive layer is provided in the pixel region, which causes the auxiliary electrically-conductive layer to be electrically coupled to the second electrode near the pixels.

According to the display unit of one embodiment of the disclosure, the second electrode is electrically coupled to the auxiliary electrically-conductive layer near the pixels, which causes a current to flow through the second electrode and the auxiliary electrically-conductive layer in the pixel region. This makes it possible to reduce resistance of the second electrode. It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. The term "disposed on/provided on/formed on" and its variants as used herein shall refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A display unit, comprising:
a substrate including a pixel region including a plurality of pixels and a peripheral region outside the pixel region;
a first electrode provided for each of the plurality of pixels in the pixel region on the substrate;
a second electrode opposed to the first electrode and provided common for the plurality of pixels;
an organic layer provided between the second electrode and the first electrode and including a light-emitting layer;
a wiring layer provided between the substrate and the first electrode;
a planarizing film between the substrate and the first electrode;
a partition wall extending from the planarizing film to the second electrode and beyond an entirety of the organic layer in a cross-sectional view; and
an auxiliary electrically-conductive layer including an organic electrically-conductive material, the auxiliary electrically-conductive layer being disposed in the pixel region on the substrate and between the second electrode and the wiring layer, the auxiliary electrically-conductive layer being electrically coupled to the second electrode,
wherein the wiring layer includes a plurality of wiring lines, the auxiliary electrically-conductive layer in direct physical contact with one of the plurality of wiring lines.

2. The display unit according to claim 1, wherein
the plurality of pixels each include the first electrode, the organic layer, and the second electrode in this order on the substrate, and
the pixel region includes, together with the plurality of pixels, an auxiliary electrically-conductive section including the auxiliary electrically-conductive layer and the second electrode on the substrate.

3. The display unit according to claim 2, wherein the auxiliary electrically-conductive section is disposed at a position not overlaid on the plurality of pixels.

4. The display unit according to claim 2, wherein the auxiliary electrically-conductive section includes the auxiliary electrically-conductive layer and the second electrode in this order on the substrate.

5. The display unit according to claim 2, the auxiliary electrically-conductive layer is electrically coupled to the one of the plurality of wiring lines.

6. The display unit according to claim 5, wherein the auxiliary electrically-conductive layer is in contact with the one of the plurality of wiring lines in the auxiliary electrically-conductive section.

7. The display unit according to claim 2, wherein the auxiliary electrically-conductive section is provided in a band-like shape in the pixel region.

8. The display unit according to claim 1, wherein each of the light-emitting layer and the auxiliary electrically-conductive layer is a printed layer.

9. The display unit according to claim 1, wherein the second electrode has a light transmissivity with respect to a light in a wavelength region generated by the light-emitting layer.

10. The display unit according to claim 1, wherein the auxiliary electrically-conductive layer has a light transmissivity with respect to a light in a wavelength region generated by the light-emitting layer.

11. The display unit according to claim 1, wherein each of the first electrode and the second electrode has a light transmissivity with respect to a light in a wavelength region generated by the light-emitting layer.

12. The display unit according to claim 1, further comprising a light adjustment film opposed to the substrate with the second electrode in between, the light adjustment film reversibly changing between a black state and a transparent state.

13. The display unit according to claim 1, wherein the auxiliary electrically-conductive layer is at a position not overlapping the plurality of pixels and directly contacting the second electrode for reducing a resistance of the second electrode.

14. A display unit, comprising:
a substrate including a pixel region including a plurality of pixels and a peripheral region outside the pixel region;
a first electrode provided for each of the plurality of pixels in the pixel region on the substrate;
a second electrode opposed to the first electrode and provided common for the plurality of pixels;
an organic layer provided between the second electrode and the first electrode and including a light-emitting layer;
a wiring layer provided between the substrate and the first electrode; and
an auxiliary electrically-conductive layer including an organic electrically-conductive material, the auxiliary electrically-conductive layer being disposed in the pixel region on the substrate and electrically coupled to the second electrode,
wherein the pixel region includes the pixels and an auxiliary electrically-conductive section including the second electrode and the auxiliary electrically-conductive layer in this order on the substrate,
and
the wiring layer includes a plurality of wiring lines, the auxiliary electrically-conductive layer in direct physical contact with one of the plurality of wiring lines.

15. The display unit according to claim 14, wherein the auxiliary electrically-conductive section is at a position not overlapping the plurality of pixels and directly contacting the second electrode for reducing a resistance of the second electrode.

16. A display unit, comprising:
a substrate including a pixel region including a plurality of pixels and a peripheral region outside the pixel region;
a first electrode provided for each of the plurality of pixels in the pixel region on the substrate;
a second electrode opposed to the first electrode and provided common for the plurality of pixels;
an organic layer provided between the second electrode and the first electrode and including a light-emitting layer;
a wiring layer provided between the substrate and the first electrode;
an auxiliary electrically-conductive layer including an organic electrically conductive material, the auxiliary electrically-conductive layer electrically coupled to the second electrode at an auxiliary electrically-conductive section; and
an insulating film between the second electrode and the substrate, wherein the insulating film defines a recess, and the auxiliary electrically-conductive layer at the auxiliary electrically-conductive section is in the recess, wherein the wiring layer includes a plurality of wiring lines, the auxiliary electrically-conductive layer in direct physical contact with one of the plurality of wiring lines.

17. The display unit according to claim 16, wherein the second electrode defines an opening, and the auxiliary electrically-conductive layer is in the opening.

18. The display unit according to claim 16, wherein the auxiliary electrically-conductive layer is transparent.

* * * * *